(12) United States Patent
Moriya

(10) Patent No.: US 7,585,697 B2
(45) Date of Patent: Sep. 8, 2009

(54) THIN-FILM TRANSISTOR, METHOD OF PRODUCING THIN-FILM TRANSISTOR, ELECTRONIC CIRCUIT, DISPLAY, AND ELECTRONIC DEVICE

(75) Inventor: Soichi Moriya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 204 days.

(21) Appl. No.: 11/589,217

(22) Filed: Oct. 30, 2006

(65) Prior Publication Data
US 2007/0099333 A1 May 3, 2007

Related U.S. Application Data

(62) Division of application No. 10/880,572, filed on Jul. 1, 2004, now abandoned.

(30) Foreign Application Priority Data

Jul. 17, 2003 (JP) .............................. 2003-198699
May 7, 2004 (JP) .............................. 2004-138562

(51) Int. Cl.
*H01L 51/40* (2006.01)
(52) U.S. Cl. ................... 438/99; 438/82; 438/149; 438/150; 438/151; 438/158; 438/161
(58) Field of Classification Search ................. 438/82, 438/99, 149–151, 158, 161
See application file for complete search history.

(56) References Cited

U.S. PATENT DOCUMENTS 5,500,537 A 3/1996 Tsumura et al.
6,326,640 B1 12/2001 Shi et al.
6,344,660 B1 2/2002 Dimitrakopoulos et al.
6,723,394 B1 * 4/2004 Sirringhaus et al. .......... 428/1.1
6,822,293 B2 * 11/2004 Yamazaki et al. ............ 257/347
7,029,945 B2 * 4/2006 Veres et al. .................... 438/99

(Continued)

OTHER PUBLICATIONS

T. Kawase et al.; "All-Polymer Thin Film Transistors Fabricated by High-Resolution Ink-jet Printing"; 2000; International Electron Device Meeting Technical Digest; pp. 623-626.

*Primary Examiner*—Kevin M Picardat
*Assistant Examiner*—Bac H Au
(74) *Attorney, Agent, or Firm*—Oliff & Berridge, PLC

(57) ABSTRACT

Aspects of the invention can provide a thin-film transistor having good transistor characteristics and operable with a low driving voltage, a method of producing such a thin-film transistor, a high-reliability electronic circuit, a display, and an electronic device. In an exemplary thin-film transistor according to the invention, a gate electrode can be formed on a substrate via an underlying layer, and a gate insulating layer can be formed on the substrate such that the gate electrode is covered with the gate insulating layer. A source electrode and a drain electrode are formed on the gate insulating layer such that they are separated from each other by a gap formed just above the gate electrode. An organic semiconductor layer can be formed thereon such that the electrodes are covered with the organic semiconductor layer. A region between the electrodes of the organic semiconductor layer functions as a channel region. A protective layer can be arranged on the organic semiconductor layer. This thin-film transistor is characterized in that the organic semiconductor layer is formed after the gate insulating layer is formed, and the gate insulating layer has the capability of causing the organic semiconductor layer to be aligned.

15 Claims, 15 Drawing Sheets

U.S. PATENT DOCUMENTS

| | | | |
|---|---|---|---|
| 7,202,495 B2 * | 4/2007 | Unno | 257/40 |
| 7,285,440 B2 * | 10/2007 | Dimitrakopoulos et al. | 438/99 |
| 2001/0052957 A1 * | 12/2001 | Ohe et al. | 349/124 |
| 2004/0075383 A1 * | 4/2004 | Endo et al. | 313/506 |
| 2004/0077122 A1 * | 4/2004 | Wu et al. | 438/99 |
| 2004/0090588 A1 * | 5/2004 | Kim et al. | 349/158 |
| 2004/0247814 A1 | 12/2004 | Sirringhaus et al. | |
| 2005/0009248 A1 * | 1/2005 | Weng et al. | 438/149 |
| 2005/0056877 A1 | 3/2005 | Rueckes et al. | |

* cited by examiner

THIN-FILM TRANSISTOR, METHOD OF PRODUCING THIN-FILM TRANSISTOR, ELECTRONIC CIRCUIT, DISPLAY, AND ELECTRONIC DEVICE

This is a Divisional of application Ser. No. 10/880,572 filed Jul. 1, 2004. The disclosure of the prior application is hereby incorporated by reference herein in its entirety.

BACKGROUND OF THE INVENTION

1. Field of Invention

An aspect of the invention relates to a thin-film transistor, a method of producing a thin-film transistor, an electronic circuit including a thin-film transistor, a display including a thin-film transistor, and an electronic device including a thin-film transistor.

2. Description of Related Art

In recent years, thin-film transistors using an organic material behaving as a semiconductor in electrical conduction (organic semiconductor material) have been developed. Thin-film transistors of this type have an advantage that a semiconductor layer can be produced by a process using a solution without needing a high-temperature process or a high-vacuum process. The thin-film transistors of this type are also advantageous in that they can be in a thin and light form, they have good flexibility, and they need low material cost. Because of those advantages, they are expected to be used as switching devices in a flexible display or the like.

It has been proposed to produce a thin-film transistor using organic materials for its gate electrode, gate insulating layer, source electrode, drain electrode, organic semiconductor layer, and alignment layer. An example of such a thin-film transistor may be found, for example, in 2000 International Electron Device Meeting Technical Digest, p. 623-626. This thin-film transistor can produced by the following production process.

First, a partition wall, which will be converted in a next step into an alignment layer, is formed on a substrate such that an area in which to form a source and an area in which to form a drain are surrounded by the partition wall, and a source electrode and a drain electrode are formed in the respective areas surrounded by the partition wall. The partition wall is then rubbed in a direction parallel to a channel direction thereby converting the partition wall into an alignment layer.

Thereafter, an organic semiconductor material is coated on the alignment layer and the organic semiconductor material is heated to a temperate at which the organic semiconductor material changes into a liquid crystal phase. Thereafter, the organic semiconductor material is cooled rapidly. As a result, an organic semiconductor layer aligned in a direction along the channel length is obtained. Thereafter, a gate insulating film is formed on the organic semiconductor layer, and a gate electrode is formed on the gate insulating film.

One of physical characteristics that determine the performance of the thin-film transistor is a carrier mobility of the semiconductor layer. The operating speed of the thin-film transistor increases with increasing carrier mobility of the semiconductor layer. However, the carrier mobility of the organic semiconductor layer is generally two or more orders of magnitude smaller than that of semiconductor layers formed of an inorganic material such as silicon, and thus it is very difficult to realize a thin-film transistor using an organic semiconductor layer having high performance and operable with a small driving voltage.

To improve the carrier mobility, investigation on many types of organic materials for organic semiconductor layers has been made. The carrier mobility depends on the gate voltage applied to the semiconductor layer via the gate electrode and also on the relative dielectric constant and the thickness of the gate insulating layer. Thus, it is also important to select a proper material for the gate insulating layer and a proper process of producing the gate insulating layer. In this regard, it has been proposed to dispose an alignment layer such as that described above to align the organic semiconductor layer in a particular direction.

However, sufficient investigation has not been performed on the optimum layer structure, and there is room for improvement in the layer structure. For example, in a case in which after an alignment layer and an organic semiconductor layer are formed, a gate insulating layer and a gate electrode are formed on the organic semiconductor layer, there is a restriction that the gate insulating layer and the gate electrode must be formed in such a manner that does not cause degradation in characteristics of the organic semiconductor layer.

In other words, when the organic semiconductor layer is formed, if the organic semiconductor material is exposed to a temperature higher than a temperate at which the organic semiconductor layer changes into a liquid crystal phase, the organic semiconductor layer is brought into a randomly aligned state, and, as a result, a great reduction in carrier mobility occurs. Besides, if the organic semiconductor layer is exposed to a temperature higher than that temperature, it loses properties of semiconductor. Another problem with the organic semiconductor layer is that it is easily damaged by an etchant such as a sulfuric acid used in photolithography process.

For the above-described reasons, high-temperature film deposition techniques such as plasma CVD or sputtering and photolithography process cannot be used to form the gate insulating film and the gate electrode. Any material that needs a similar micro fabrication technique cannot be employed. Thus, when a thin-film transistor is formed using an organic semiconductor layer, a high enough carrier mobility of the organic semiconductor layer is not achieved, and thus a high driving voltage is required, and the operating speed is low.

SUMMARY OF THE INVENTION

An exemplary embodiment of the invention provides a thin-film transistor having good transistor characteristics and capable of operating with a low driving voltage, a method of producing such a thin-film transistor in an easy and highly reliable manner, a high-reliability electronic circuit, a display, and an electronic device.

In an aspect, the invention can provide a thin-film transistor having an organic semiconductor layer including a channel region, a source region and a drain region formed such that the channel region is disposed between the source region and the drain region, a gate electrode corresponding to the channel region, and a gate insulating layer disposed between the gate electrode and the organic semiconductor layer and having an alignment surface layer on a side facing the organic semiconductor layer, the alignment surface layer serving to align the organic semiconductor layer. The thin-film transistor in this aspect of the invention has good transistor characteristics and can operate with a low driving voltage.

In this thin-film transistor, the alignment surface layer may be formed by aligning the gate insulating layer in a particular direction, and the organic semiconductor layer may be aligned by the alignment surface in a direction along the particular direction. The alignment surface layer may be formed by forming a plurality of grooves in a particular direction on a surface, facing the organic semiconductor layer, of the gate insulating layer, and the organic semiconductor layer may be aligned in the particular direction by the alignment surface layer. The resultant thin-film transistor produced in this manner has good transistor characteristics and can operate with a low driving voltage.

Preferably, the particular direction can be substantially parallel with a direction from one of the source region and the drain region to the other one. This allows the channel region to have a still higher carrier mobility, and thus the resultant thin-film transistor can have good transistor characteristics and can operate with a low driving voltage.

In the exemplary thin-film transistor according to the invention, preferably, the alignment surface layer of the gate insulating film is formed by performing alignment treatment on its surface facing the organic semiconductor layer. This makes it possible to impart a high alignment capability to the gate insulating layer. In the thin-film transistor according to the invention, preferably, the gate insulating film is formed such that at least its surface layer facing the organic semiconductor layer is formed of an organic material including mainly a polyimide resin. This makes it possible to more easily impart a high alignment capability to the gate insulating layer. Furthermore, good adhesion is achieved between the gate insulating layer and the organic semiconductor layer.

In the exemplary thin-film transistor according to the invention, preferably, the gate insulating film includes a layer formed mainly of an inorganic material on a side opposite to the organic semiconductor layer. This makes it possible to well control the characteristics of the gate insulating layer. More specifically, the gate insulating layer can have a greater relative dielectric constant and can be well aligned, and thus a greater improvement in carrier mobility of the channel region can be achieved.

In the exemplary thin-film transistor according to the invention, preferably, the inorganic material includes silicon oxide or nitride oxide as a main ingredient. Those materials have a high relative dielectric constant. In the thin-film transistor according to the invention, preferably, the organic material includes a polyimide resin as a main ingredient. This allows the gate insulating layer to be excellent also in terms of resistance to high temperature and resistance to chemicals.

In the thin-film transistor according to the invention, preferably, the polyimide resin can be formed of diallyl ketone. This allows the gate insulating layer to be easily aligned by means of optical alignment process. In the thin-film transistor according to the invention, preferably, the gate insulating film is in contact with the organic semiconductor layer. This makes it possible for the organic semiconductor layer to have a better alignment capability. In the thin-film transistor according to the invention, preferably, the organic semiconductor layer is formed mainly of an organic polymer material. This makes it possible to easily impart the alignment capability to the organic semiconductor layer.

In the exemplary thin-film transistor according to the invention, preferably, the source electrode and the drain electrode are each formed mainly of a conductive polymer material. The source region and the drain region are a source electrode and a drain electrode, respectively, formed such that the channel region is disposed between the source electrode and the drain electrode. Use of a conductive polymer material makes it possible to form a film by means of coating (solution process) without needing high-temperature treatment, and thus it is possible to form the source electrode and the drain electrode without causing degradation of the alignment characteristics of the gate insulating film.

Preferably, the thin-film transistor according to the invention can include a substrate for supporting the organic semiconductor layer, the gate electrode, the gate insulating film, the source electrode and the drain electrode, wherein the relative location of the gate electrode with respect to the substrate is closer than that of the source electrode and the drain electrode is. That is, a thin-film transistor having a bottom gate structure can be advantageously achieved by the invention.

The invention can also provide a method of producing a thin-film transistor, comprising the steps of forming a gate electrode, forming a gate insulating layer on the gate electrode, forming an organic semiconductor layer including a channel region on the gate insulating layer, and forming a source region and a drain region such that the channel region is disposed between the source region and the drain region. In the step of forming the organic semiconductor layer, at least a part, on a side facing the gate insulating layer, of the organic semiconductor layer is aligned. This method according to the invention can make it possible to produce a thin-film transistor capable of operating with a low driving voltage and having good transistor characteristics, in an easy and highly reliable manner.

In this method of producing a thin-film transistor according to the invention, preferably, the organic semiconductor layer is formed such that the organic semiconductor layer is at least partially in contact with the gate insulating film and such that the organic semiconductor layer is aligned at least in its surface layer facing the gate insulating film. This method according to the invention makes it possible to produce a thin-film transistor capable of operating with a low driving voltage and having good transistor characteristics, in an easy and highly reliable manner.

Preferably, the method of producing a thin-film transistor according to the invention can further include performing an alignment treatment on a surface, facing the organic semiconductor layer, of the gate insulating layer, and after completion of the step of performing the alignment processing, the step of forming the source region and the drain region is performed such that the source region and the drain region are spaced apart from each other along the direction in which the surface of the gate insulating layer is aligned. This makes it possible to align the gate insulating film in a more reliable fashion. In this method of producing a thin-film transistor, preferably, the alignment treatment is performed by means of rubbing or optical alignment process. This makes it possible to more easily align the gate insulating film.

Preferably, the method of producing a thin-film transistor according to the invention can further include performing an alignment treatment at least on a surface, facing the organic semiconductor layer, of the gate insulating layer, after the step of forming the source region and the drain region. This makes it possible to impart a high alignment capability to the gate insulating film in a highly reliable fashion.

In this method of producing a thin-film transistor, preferably, the alignment treatment is performed by optical alignment process. This makes it possible to more surely impart a high alignment capability to the gate insulating film. In the method of producing a thin-film transistor according to the invention, preferably, in the step of forming the gate insulating layer, a first layer including mainly an inorganic material is formed and then a second layer including mainly an organic material is formed on the first layer. This allows the gate insulating layer to have a high relative dielectric constant and a high alignment capability.

In this method of producing a thin-film transistor according to the invention, preferably, the first layer is formed by a thermal oxidation method, a CVD method, a SOG method, or a polysilazane method. This method allows the first layer (inorganic layer) to be easily formed. In this method of producing a thin-film transistor, preferably, in the step of forming the organic semiconductor layer, an organic semiconductor material is heated to a temperature higher than a temperature at which the organic semiconductor material changes into a liquid crystal phase, and then the organic semiconductor material is cooled. This makes it possible for the organic semiconductor layer to have a better alignment characteristic.

Aspects of the invention can also provide an electronic circuit including the thin-film transistor described above. This makes it possible to realize an electronic circuit having high reliability. The invention also provides a display including the electronic circuit described above. This makes it possible to realize a display having high reliability. The invention also provides an electronic device including a power supply and a display according to the invention. This makes it possible to realize an electronic device having high reliability.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Exemplary thin-film transistor, the method of producing a thin-film transistor, the electronic circuit, the display, and the electronic device, according to the invention, are described in further detail below with reference to preferred embodiments in conjunction with the accompanying drawings.

Figure 1:
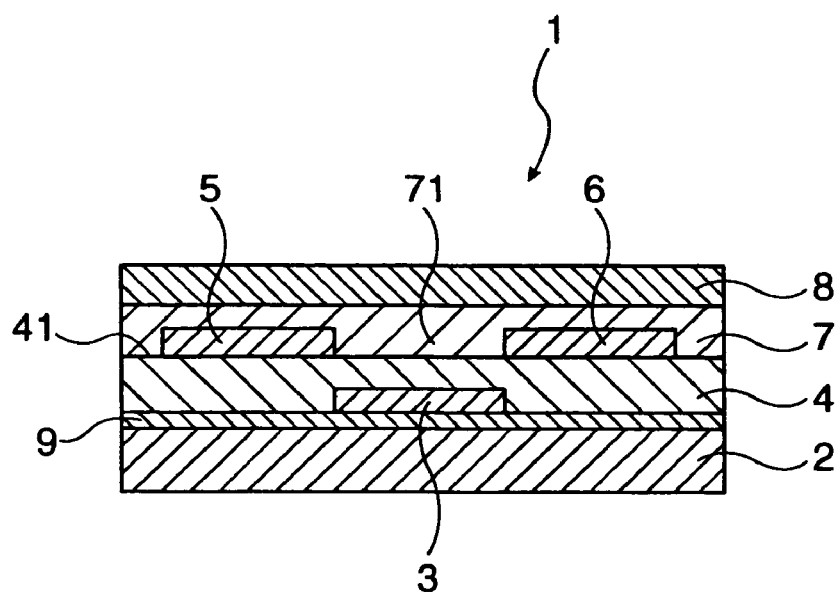
FIG. 1 is a longitudinal sectional view of a thin-film transistor according to a first embodiment of the invention.
Figure 2:
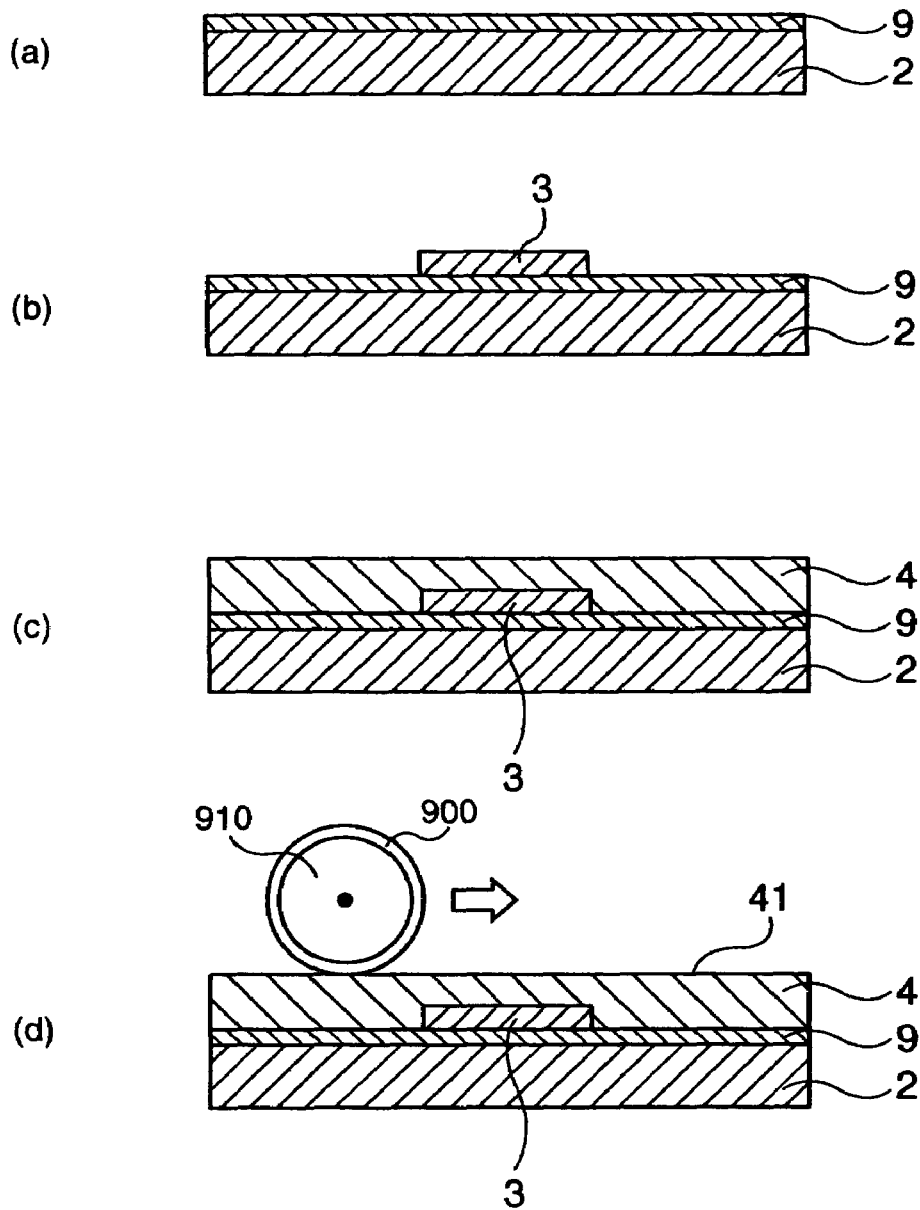
FIG. 2 is a diagram (longitudinal sectional view) illustrating a first method of producing the thin-film transistor shown in FIG. 1.
Figure 3:
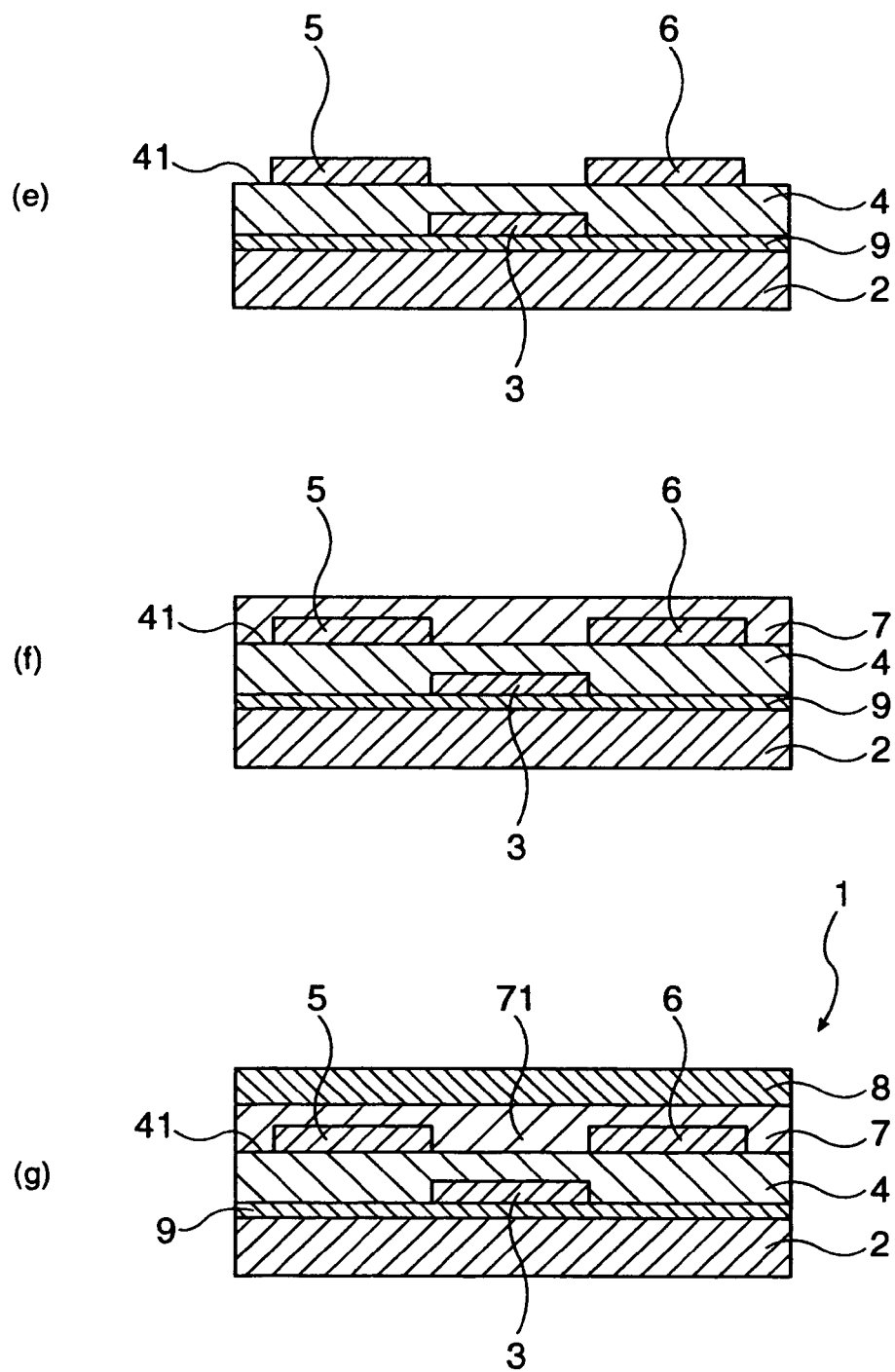
FIG. 3 is a diagram (longitudinal sectional view) illustrating the first method of producing the thin-film transistor shown in FIG. 1.
Figure 4:
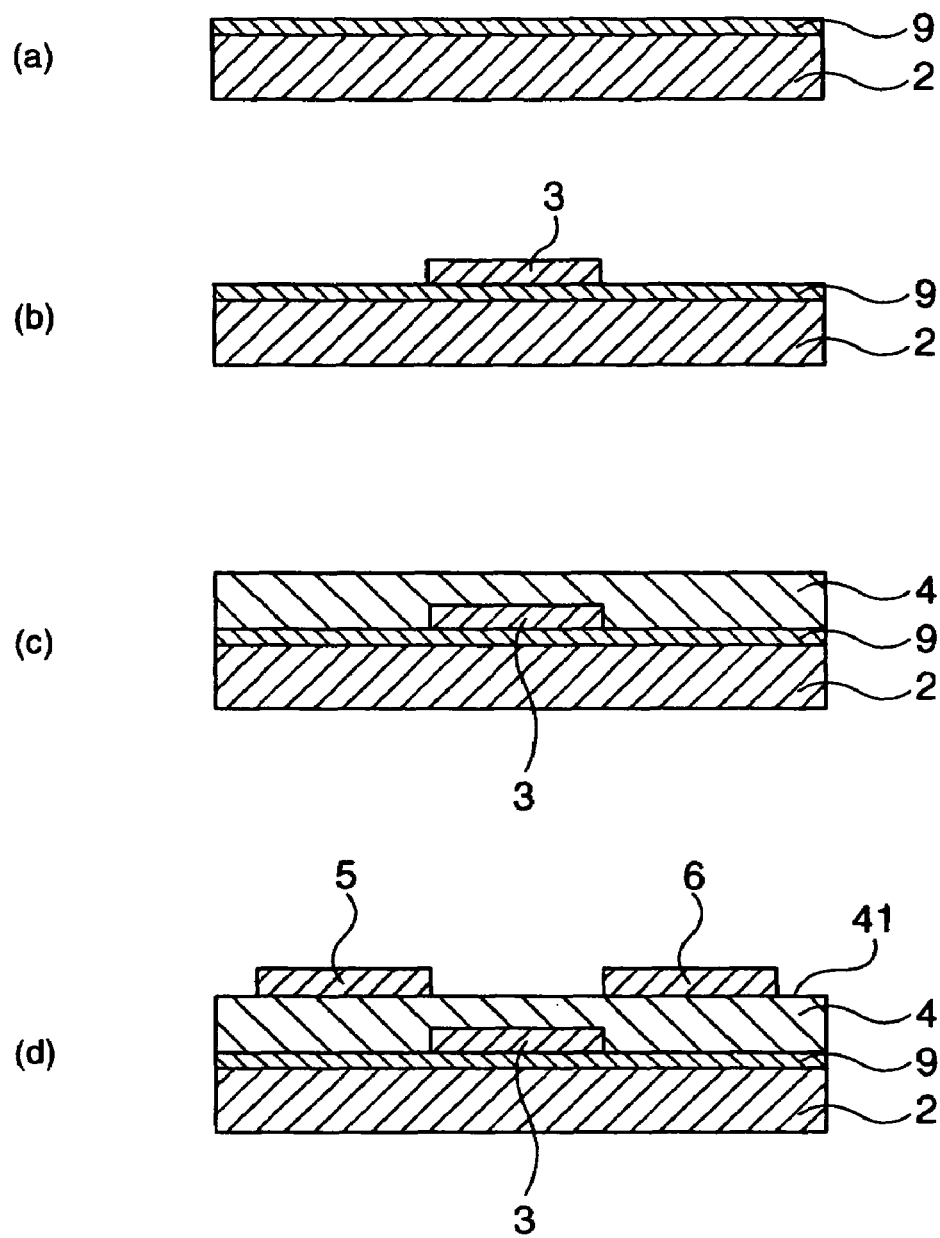
FIG. 4 is a diagram (longitudinal sectional view) illustrating a second method of producing the thin-film transistor shown in FIG. 1.
Figure 5:
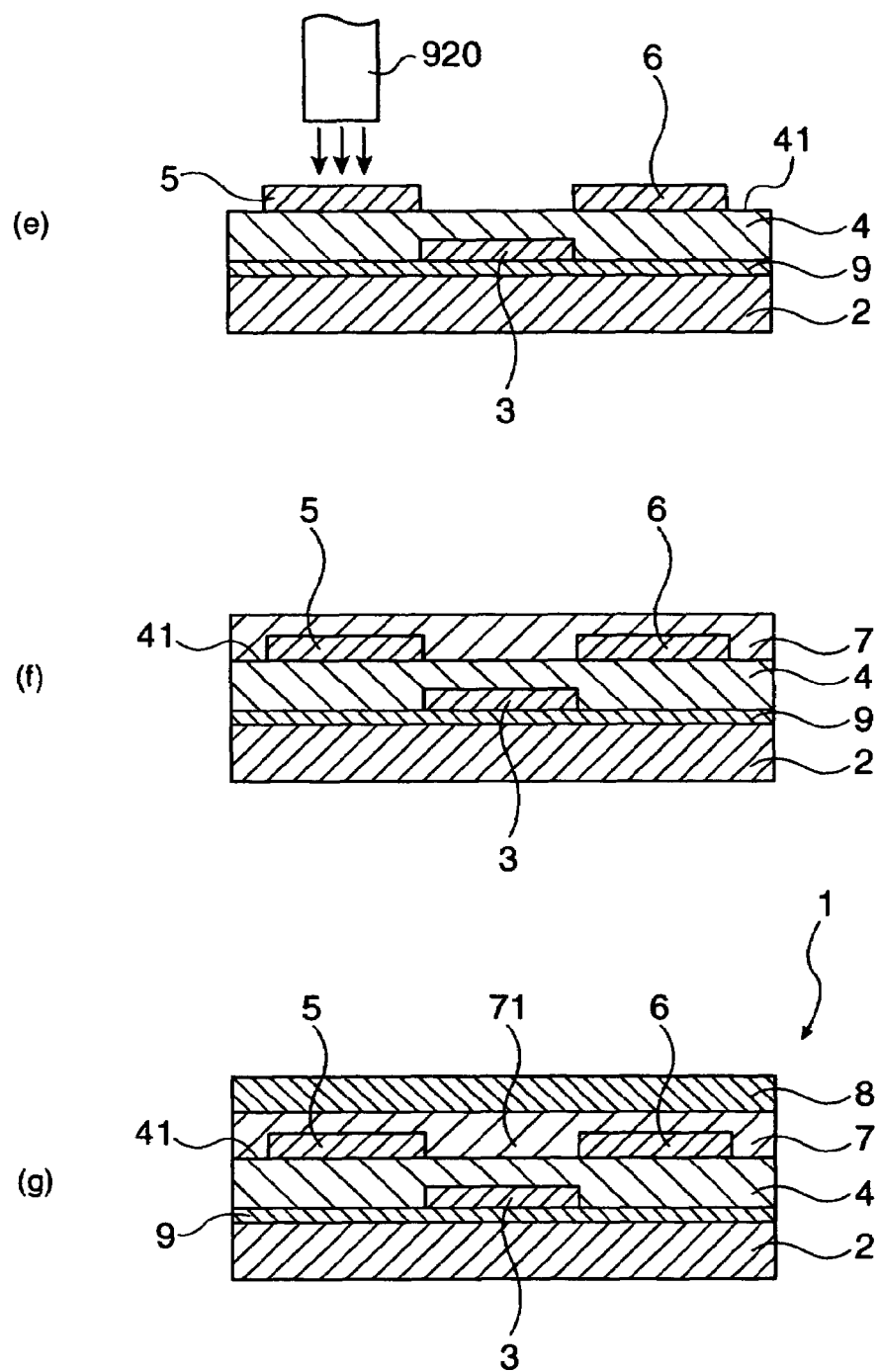
FIG. 5 is a diagram (longitudinal sectional view) illustrating the second method of producing the thin-film transistor shown in FIG. 1.

First, a thin-film transistor according to an exemplary embodiment of the invention is described below. FIG. 1 is a longitudinal sectional view of a thin-film transistor according to a first exemplary embodiment of the invention. FIGS. 2 and 3 are diagrams (longitudinal sectional views) illustrating a first method of producing the thin-film transistor shown in FIG. 1. FIGS. 4 and 5 are diagrams (longitudinal sectional views) illustrating a second method of producing the thin-film transistor shown in FIG. 1. Note that expressions in terms of relative positions or relative direction, such as "up", "upper", "down", "lower", etc., used in the following description to indicate relative positions of various parts are defined such that "upper" and similar expressions denote upper parts in FIGS. 1 to 5 and "lower" and similar expressions denote lower parts.

As shown in FIG. 1, a thin-film transistor 1 includes a substrate 2, an underlying layer 9, a gate electrode 3, a gate insulating layer 4, a source electrode 5, a drain electrode 6, an organic semiconductor layer 7, and a protective layer 8, which are formed one on another in the order described above.

More specifically, in the thin-film transistor 1, the gate electrode 3 is formed on the substrate 2 via the underlying layer 9, and, furthermore, the gate insulating film 4 is formed on the substrate 2 such that the gate electrode 3 is covered with the gate insulating film 4. The source electrode 5 and the drain electrode 6 are formed on the gate insulating layer 4 such that they are separated from each other by a gap formed just above the gate electrode 3. Furthermore, on the gate insulating layer 4, the organic semiconductor layer 7 is formed such that the source electrode 5 and the drain electrode 6 are covered with the organic semiconductor layer 7. In this organic semiconductor layer 7, a region (above the gate electrode 3) between the source electrode 5 and the drain electrode 6 finctions as a channel region 71 in which carriers are transported. The protective layer 8 is formed on the organic semiconductor layer 7.

In this thin-film transistor 1, the gate electrode 3 is located in a layer that is below the gate insulating layer 4 above which there is a layer in which the source electrode 5 and the drain electrode 6 are located. In other words, the layer in which the gate electrode 3 is formed is located closer to the substrate 2 than the layer of the source electrode 5 and the drain electrode 6 is. This structure of the thin-film transistor is referred to as a bottom gate structure.

The structure of the thin-film transistor 1 is described in further detail below for each part thereof.

The substrate 2 serves to support various layers (various parts) of the thin-film transistor 1. The substrate 2 may be formed of, for example, glass, plastic (resin) such as polyethylene terephthalate (PET), polyethylene naphthalate (PEN), polyeter sulfone (PES), or aromatic polyester (liquid crystal polymer), quartz, silicon, or gallium arsenide. When the thin-film transistor 1 needs to be flexible, the substrate 2 is formed of a plastic material.

The underlying layer 9 is formed on the substrate 2. The underlying layer 9 serves to prevent ions from being diffused from the surface of the substrate 2 and also serves to improve the adhesion between the gate electrode 3 and the substrate 2.

Although there is no particular restriction on the material of the underlying layer 9, silicon oxide or silicon nitride is preferably used when the substrate 2 is made of glass.

There is no particular restriction on the thickness (average thickness) of the underlying layer 9, but the thickness may be properly determined depending on the purpose. For example, the thickness of the underlying layer 9 is preferably set in the range from 1 to 500 nm, and more preferably in the range from 10 to 300 nm.

The underlying layer 9 is not necessarily needed, and it may be omitted.

The gate electrode 3 is formed on the underlying layer 9. The electrode 3 may be formed of, for example, a metal such as Pd, Pt, Au, W, Ta, Mo, Al, Cr, Ti, or Cu, an alloy of two or more of such metals, a carbon material such as carbon black, carbon nanotube, or fullerene, polythiophene such as polyacetylene, polypyrrole, or PEDOT (poly-ethylenedioxythiophene), a conductive polymer material such as polyaniline, poly(p-phenylene), poly(p-phenylenevinylene), polyfluorene, polycarbazole or polysilane, or a derivative thereof.

Although there is no particular restriction on the thickness (average thickness) of the gate electrode 3, the source electrode 5, and the drain electrode 6, the thickness thereof is preferably selected within a range from 0.1 to 2000 nm, and more preferably within a range from 1 to 1000 nm.

The gate insulating layer 4 is formed on the underlying layer 9 such that the gate electrode 3 is covered with the gate insulating film 4.

The gate insulating film 4 serves to isolate the gate electrode 3 from the source electrode 5 and the drain electrode 6 and also servers to align the organic semiconductor layer 7 which will be formed on the gate insulating film 4. That is, the gate insulating film 4 functions as both the insulating film and the alignment layer.

This makes it possible to align the organic semiconductor layer 7 into a desirable direction without causing an increase in complexity of the layer structure of the thin-film transistor 1, and thus an improvement in the carrier mobility of the channel region 71 is achieved.

In the exemplary embodiment, the gate insulating film 4 is aligned such that at least its upper surface and nearby portion 41 (facing the organic semiconductor layer 7) is aligned in a predetermined direction substantially parallel with the direction of the gate length (in a direction from right to left in FIG. 1) of the channel region 71. The organic semiconductor layer 7 is also aligned in a direction parallel with the direction in which the gate insulating film 4 is aligned, that is, in a direction substantially parallel with the direction of the gate length of the channel region 71. This allows the channel region 71 to have a particularly high carrier mobility.

The gate insulating film 4 does not necessarily need to be aligned over all area of the gate insulating film 4, but it is sufficient if at least a part thereof corresponding to the channel region 71 of the organic semiconductor layer 7 is aligned.

Preferably, the gate insulating film 4 is mainly formed of an organic material (and more preferably, of an organic polymer material). Use of an organic polymer material as a main material makes it possible to easily form the gate insulating layer 4 and also makes it possible to easily align it. Furthermore, good adhesion is achieved between the gate insulating layer 4 and the organic semiconductor layer 7 formed on the gate insulating layer 4.

Specific examples of organic polymer materials for the above purpose include a polyimide resin, a polyamide-imide resin, and polytetrafluoroethylene. One of such resin materials may be used singly or any combination of two or more of such resin materials may be used. Of those materials, a polyamide-imide resin is more preferable. Use of a polyamide-imide resin as the main material for the gate insulating layer 4 allows the resultant gate insulating layer 4 to have, in addition to the advantages described above, an additional advantage that the gate insulating layer 4 has high resistance to temperature and chemicals.

Although there is no particular restriction on the thickness (average thickness) of the gate insulating layer 4, the thickness is preferably selected in the range from 10 to 500 nm and more preferably in the range from 50 to 1000 nm If the thickness of the gate insulating layer 4 is set within the preferable range described above, the gate electrode 3 can be isolated from the source electrode 5 and the drain electrode 6 in a highly reliable fashion without causing an increase in size (particular thickness) of the thin-film transistor 1.

The source electrode 5 and the drain electrode 6 are formed on the gate insulating layer 4 such that they are spaced apart from each other by a predetermined distance in a direction parallel to the alignment direction of the gate insulating layer 4. The source electrode 5 and the drain electrode 6 can be formed of a material properly selected depending on the method of producing the thin-film transistor 1 as is described below.

In a case in which the source electrode 5 and the drain electrode 6 are formed on the gate insulating film 4 after alignment treatment is performed on the gate insulating film 4 (that is, in a case in which the first production method shown in FIGS. 2 and 3 is employed), a conductive polymer material is preferably used as a main material of the source electrode 5 and the drain electrode 6.

When a conductive polymer material is used, a film can be formed by coating (solution process) without needing high-temperature treatment, and thus it is possible to form the source electrode 5 and the drain electrode 6 without causing degradation of the alignment characteristics of the gate insulating film 4.

The above-described specific examples of conductive polymer materials for the gate electrode 3 are also usable for the source electrode 5 and the drain electrode 6.

On the other hand, in a case in which after the source electrode 5 and the drain electrode 6 are formed on the gate insulating film 4, alignment processing is performed on the gate insulating film 4 (that is, in a case in which the second production method shown in FIGS. 4 and 5 is employed), not only a conductive polymer material but also a metal can be preferably used as a main material of the source electrode 5 and the drain electrode 6.

The advantage of metal materials is that it is possible to easily produce the source electrode 5 and the drain electrode 6 with high dimensional accuracy in a highly reliable fashion by using a film formation process such as plasma CVD or sputtering. This makes it possible that the distance (channel length) between the source electrode 5 and the drain electrode 6 is set to a rather small value, which results in a reduction in driving voltage, an improvement in transistor characteristic, and an increase in integration density of the thin-film transistor 1.

The above-described specific examples of metal materials for the gate electrode 3 are also usable for the source electrode 5 and the drain electrode 6.

The organic semiconductor layer 7 is disposed on the gate insulating film 4 such that the source electrode 5 and the drain electrode 6 are covered with the organic semiconductor layer 7 and such that the organic semiconductor layer 7 is in contact with the gate insulating film 4.

An organic semiconductor material (organic material behaving as a semiconductor in electrical conduction) is used as a main material of the organic semiconductor layer 7. In the embodiment, the channel region 71 of the organic semiconductor layer 7 is aligned by the alignment capability of the gate insulating film 4 in a direction substantially parallel to the channel length direction. This allows the channel region 71 to have a high carrier mobility, and thus allows the thin-film transistor 1 to have good transistor characteristics and to operate with a low driving voltage.

By disposing the organic semiconductor layer 7 in direct contact with the gate insulating film 4 in the above-described manner, it becomes possible for the alignment capability of the gate insulating film 4 to cause the organic semiconductor layer 7 to be well aligned.

Specific examples of organic semiconductor materials for the above purpose include a low-molecular organic semiconductor material such as naphthalene, anthracene, tetracene, pentacene hexacene phthalocyanine, perylene hydrazone, triphenylmethane, diphenyl methane, stilbene, arylvinyl pyrazoline, triphenylamine, or triarylamine or a derivative thereof, and an organic polymer semiconductor material such as poly-N-vinylcarbazol, polyvinyl pyrene, polyvinylanthracene, polythiophene, poly(p-phenylenevinylene), pyrene formaldehyde resin, ethylcarbazole formaldehyde resin, or fluorene-bithiophene copolymer or a derivative thereof. One of such an organic semiconductor material may be used singly or any combination of two or more of such organic semiconductor materials may be used. Of those materials, organic polymer semiconductor materials are more preferable, because organic polymer semiconductor materials can be easily aligned using a simple method.

If an organic polymer semiconductor material is used as a main material to form the organic semiconductor layer 7, the resultant organic semiconductor layer 7 can be thin, light, and flexible, and thus the resultant thin-film transistor can advantageously used as a switching device of a flexible display.

The thickness (average thickness) of the organic semiconductor layer 7 is preferably selected in the range from 0.1 to 1000 nm and more preferably in the range from 1 to 100 nm.

The organic semiconductor layer 7 does not necessarily need to be formed such that the source electrode 5 and the drain electrode 6 are coved with the organic semiconductor layer 7, but it is sufficient if the organic semiconductor layer 7 is disposed at least in the region (channel region 71) between the source electrode 5 and the drain electrode 6.

The protective layer 8 is formed on the organic semiconductor layer 7. The protective layer 8 serves to protect various layers of the thin-film transistor 1. Specific examples of materials of the protective layer 8 include polyolefin such as polyethylene, polypropylene, or ethylene- vinyl acetate copolymer, s liquid crystal polymer such as denatured polyolefin polyamide (for example, Nylon 6, Nylon 46, Nylon 66, Nylon 610, Nylon 612, Nylon 11, Nylon 12, Nylon 6/12, or Nylon 6/66), thermoplastic polyimide, or aromatic polyester, polyphenylene oxide, polyphenylene sulfide, polycarbonate, poly methyl methacrylate (PMMA), polyeter, polyeheretherketone, polyetherimide, polyacetal, thermoplastic elastomer such as styrene thermoplastic elastomer, polyolefin thermoplastic elastomer, polyvinyl chloride thermoplastic elastomer, polyurethane thermoplastic elastomer, polyester thermoplastic elastomer, polyamide thermoplastic elastomer, polybutadiene thermoplastic elastomer, trans-polyisoprene thermoplastic elastomer, fluoro rubber thermoplastic elastomer, or chlorinated polyethylene thermoplastic elastomer, and copolymers, blending polymers, or polymer alloys thereof. One of such a material may be used singly or any combination of two or more of such materials may be used.

Although there is no particular restriction on the thickness (average thickness) of the protective layer 8, the thickness is preferably selected in the range from 1 to 500 nm and more preferably in the range from 10 to 300 nm.

The protective layer 8 is not necessarily needed, and it may be omitted.

In the thin-film transistor 1, the current flowing between the source electrode 5 and the drain electrode 6 is controlled by controlling the voltage applied to the gate electrode 3. In other words, when no voltage is applied to the gate electrode 3, the thin-film transistor 1 is in a OFF state. In this state, there is substantially no carrier in the organic semiconductor layer 7, and thus substantially no current flows even if a voltage is applied between the source electrode 5 and the drain electrode 6. On the other hand, when a voltage is applied to the gate electrode 3 such that the thin-film transistor 1 is brought into a ON state, charge is induced in the organic semiconductor layer 7 in its surface region facing the gate insulating layer 4, and a channel region (path of carriers) 71 is formed. In this state, if a voltage is applied between source electrode 5 and the drain electrode 6, a current flows through the channel region 71.

The thin-film transistor 1 having the structure described above can be produced as follows. First, a first method of producing the thin-film transistor 1 is described.

First, the underlying layer 9 is formed on the substrate 2. The formation of the underlying layer 9 can be accomplished, for example, by a thin-film formation process, such as CVD, sputtering, or vacuum evaporation, a spin-on-glass (SOG) process, or a wet process.

The gate electrode 3 is then formed on the underlying layer 9 as follows. First, a metal film (metal layer) is formed on the underlying layer 9 by means of, for example, chemical vapor deposition (CVD) such as plasma CVD, thermal CVD, or laser CVD, dry plating such as vacuum evaporation, sputtering (low-temperature sputtering), or ion plating, wet plating such as electrolytic plating, immersion plating, or electroless plating, puttering, sol-gel process, MOD process, or bonding of a metal foil.

Thereafter, a resist is coated on the metal film and baked such that a resist pattern corresponding to the shape of the gate electrode 3 is formed. Unnecessary portions of the metal film are then removed using the resist pattern as a mask. The removal of the unnecessary portions of the metal film can be accomplished, for example, by physical etching such as plasma etching, reactive ion etching, beam etching, or photo-assisted etching, or chemical etching, such as wet etching. Of those etching processes, one may be used or a combination of two or more those etching processes may be employed.

After completion of the etching process, the resist is removed. Thus, the gate electrode 3 is obtained. The gate electrode 3 may also be formed, for example, by coating (applying) a conductive material including conductive particles on the underlying layer 9 and then performing proper post-processing (for example, heating, irradiation with an infrared ray, or applying of ultrasonic wave) on the coated conductive material.

The coating of the conductive material can be accomplished, for example, by spin coating, casting, micro gravure coating, gravure coating, bar coating, roll coating, wire bar coating, dip coating, spray coating, screen printing, flexographic printing, offset printing, ink-jet printing, or micro contact printing. The coating may be performed by one of the coating methods described above or any combination of two or more of the methods.

After completion of forming the gate electrode 3 on the underlying layer 9, the gate insulating layer 4 is further formed on the underlying layer 9. In the case in which the gate insulating layer 4 is formed using an organic polymer material, a solution containing an organic polymer or a precursor thereof is first coated (applied) on the underlying layer 9 using a proper coating method selected from the coating methods described above such that the gate electrode 3 is covered with the coated solution, and then proper post-processing (for example, heating, irradiation with an infrared ray, or applying of ultrasonic wave) is performed on the coated film.

Thereafter, alignment treatment, such as rubbing is performed on the upper surface 41 (the surface opposite to the substrate 2) of the gate insulating layer 4 such that the upper surface 41 and its nearby portion of the gate insulating layer 4 is aligned in a predetermined direction (parallel with a direction from left to right in FIG. 2). Thus, the gate insulating layer 4 that is electrically insulating and is aligned in the particular direction is obtained.

More specifically, rubbing is performed as follows. A rotating roller 910 around which a cloth 900 of polyamide (Nylon) or the like is wound is pressed against the gate insulating layer 4 such that the gate insulating layer 4 is pushed into the cloth 900 to a particular depth thereby rubbing the upper surface 41 of the gate insulating layer 4 in a particular direction. By rubbing the gate insulating layer 4 in the above-described manner, it is possible to easily align the gate insulating layer 4.

The rubbing conditions are properly determined depending on the material of the gate insulating layer 4. Specific rubbing conditions are described below by way of example, but not by way of limitation. The pushing depth is preferably selected in the range from 0.01 to 1 mm and more preferably in the range from 0.1 to 0.5 mm. The rotation speed is preferably selected in the range from 10 to 5000 rpm and more preferably in the range from 100 to 1000 rpm. The feeding speed is preferably selected in the range from 0.01 to 50 m/min and more preferably in the range from 0.1 to 10 m/min.

The alignment process may also be performed using an optical alignment process which will be described later in the second production method. Not only in the method of aligning the gate insulating layer 4 by means of rubbing, but also in the method of producing a plurality of thin grooves on the surface of the gate insulating layer 4 by rubbing, it is possible to align the organic semiconductor layer 7 by rapidly cooling the organic semiconductor layer as will be described in further detail below. Preferably, the thin grooves are formed such that they extend in a direction substantially parallel with the direction from one of the source region and the drain region to the other. Furthermore, preferably, when the grooves are formed, their depth and pitch are optimized depending on the manner in which to align the organic semiconductor layer.

Subsequently, the source electrode 5 and the drain electrode 6 are formed on the gate insulating layer 4 such that the source electrode 5 and the drain electrode 6 are spaced apart from each other in a direction parallel with the direction in which the gate insulating layer 4 is aligned.

The source electrode 5 and the drain electrode 6 can be formed using a similar process to that used to form the gate insulating layer 4.

Of various coating methods, a direct formation method, such as the ink-jet printing method or the micro contact printing method, is preferable in that the source electrode 5 and the drain electrode 6 can be formed without causing degradation in alignment of the gate insulating layer 4 aligned in the previous step.

After completion of forming the source electrode 5 and the drain electrode 6 on the gate insulating layer 4, the organic semiconductor layer 7 can be formed such that the source electrode 5 and the drain electrode 6 are covered with the organic semiconductor layer 7 and such that the organic semiconductor layer 7 is in contact with the gate insulating layer 4. As a result, the channel region 71 is formed between the source electrode 5 and the drain electrode 6 (at a location corresponding to the gate electrode 3).

The organic semiconductor layer 7 can be formed using a similar process to that used to form the gate insulating layer 4. In the process of forming the organic semiconductor layer 7, a coated film of an organic semiconductor material is preferably heated to a temperature higher than a temperature at which the organic semiconductor material changes into a liquid crystal phase, and then the film is cooled (preferably rapidly). This process allows the organic semiconductor layer 7 to be well aligned in a direction parallel with the direction in which the gate insulating film 4, that is, in the direction of the channel length of the channel region 71 (in the direction from left to right in FIG. 3).

When the organic semiconductor material changes into the liquid crystal phase at 280° C., it is preferable to heat the organic semiconductor material to a temperature of 280 to 280+30° C. and more preferably 280 to 280+10° C. If the heating temperature is too high, degradation occurs in characteristics of some portions of the thin-film transistor 1, or the heating at such high temperate causes the resultant organic semiconductor material to lose properties that semiconductor must have.

The heating is not necessarily needed, but it can be performed as required. For example, in a case in which when the organic semiconductor material is coated into the form of a film, the resultant coated film has already been aligned via the film formation process in a direction parallel with the direction of the channel length of the channel region 71, the heating process may be omitted.

It should be understood that the method of aligning the organic semiconductor layer 7 is not limited to the rapid cooling described above. An example of alternative methods is to pass a current between the source electrode and the drain electrode while heating the organic semiconductor material thereby aligning the organic semiconductor layer 7 into a direction along the channel length of the channel region 71. Another example is to apply a magnetic field to the organic semiconductor material in a direction along the channel length of the channel region 71 of the thin-film transistor 1 while heating the organic semiconductor material.

It should also be understood that the region in which the organic semiconductor layer 7 is formed is not limited to that shown in the figure. For example, the organic semiconductor layer 7 may be formed only in the region (the channel region 71) between the source electrode 5 and the drain electrode 6. This is preferable when a plurality of thin-film transistors 1 (devices) are formed side by side on the same substrate, because the organic semiconductor layers 7 are formed separately for the respective devices and thus leakage currents or crosstalk among devices can be suppressed. Furthermore, the necessary amount of the organic semiconductor material can be minimized, and thus a reduction in production cost is achieved.

Subsequently, the protective layer 8 is formed on the organic semiconductor layer 7. The protective layer 8 can be formed in a similar manner to the gate insulating film 4. Via the process described above, the thin-film transistor 1 according to the first exemplary embodiment is obtained.

In the production method described above, the organic semiconductor layer 7 is formed after the formation of the gate insulating film 4. In other words, at the state at which the gate electrode 3 and the gate insulating film 4 are formed, the organic semiconductor layer 7 is not yet formed. Therefore, the conditions of forming the gate electrode 3 and the conditions of forming the gate insulating layer 4, such as the formation temperature and the etching solution, can be selected without concern for the possibility of causing degradation in alignment characteristic or other characteristics of the organic semiconductor layer 7. This makes it possible to form the gate electrode 3 and the gate insulating layer 4 having optimum sizes using an optimum material, and thus it becomes possible to achieve a high carrier mobility in the channel region 71.

Now, a second method of producing the thin-film transistor 1 is described. In the following description of the second production method with reference to FIGS. 4 and 5, the description is focused on differences from the first production method described above, and similar processes are not described.

The second production method is similar to the first production method except that the alignment treatment on the gate insulating layer 4 is performed after the source electrode 5 and the drain electrode 6 are formed on the gate insulating layer 4.

The underlying layer is formed in a similar manner to the step described above.

The gate electrode is formed in a similar manner to the step described above.

The gate insulating film is formed in a similar manner to the step described above.

In this second production method, the alignment treatment on the gate insulating layer 4 is performed in a later step after the source electrode 5 and the drain electrode 6 are formed. Therefore, it is desirable that the material of the gate insulating layer 4 be properly selected from the above-described materials so that the gate insulating layer 4 can be aligned in the alignment process performed after the source electrode 5 and the drain electrode 6 are formed. In this regard, an example of a preferable material is a polyimide resin in the form of diallyl ketone.

If a polyimide resin in the form of diallyl ketone is used as a main material of the gate insulating layer 4, it is possible to easily and well align the gate insulating layer 4 by means of an optical alignment process.

The source electrode and the drain electrode are formed in a similar manner to the step described above.

Alignment treatment by optical alignment is performed on the upper surface 41 of the gate insulating layer 4 such that the upper surface 41, and a nearby portion of the gate insulating layer 4 are aligned in the same direction as the direction from the source electrode 5 to the drain electrode or as the direction from the drain 6 to the source electrode 5 (from left to right or from right to left, in FIG. 5) that is, in a direction substantially parallel with the direction of the gate length of the channel region 71. Thus, the gate insulating layer 4 that is electrically insulating and is aligned in the particular direction is obtained.

In the optical alignment process, the gate insulating layer 4 is directly illuminated with polarized light emitted from a polarized light source 920 thereby causing reaction to occur selectively in polymer chains extending in the same direction as the direction the light is polarized. The optical alignment process allows the gate insulating layer 4 to be aligned without creating dust from the gate insulating layer 4 and without generating static charge. This prevents degradation in performance of the thin-film transistor 1.

Preferably, the optical alignment process on the gate insulating layer 4 is performed while heating the gate insulating layer 4. This makes it possible to align the gate insulating layer 4 in a better manner and in a shorter time. Although there is no particular restriction on the temperate at which heating is performed (heating temperature), the temperature is preferably selected in the range from 50 to 300° C., and more preferably in the range from 100 to 200° C.

The organic semiconductor layer is formed in a similar manner to the step described above.

The protective layer is formed in a similar manner to the step described above. Via the process described above, the thin-film transistor 1 according to the first exemplary embodiment is obtained. The second production method also has advantages similar to those of the first production method described above.

Figure 6:
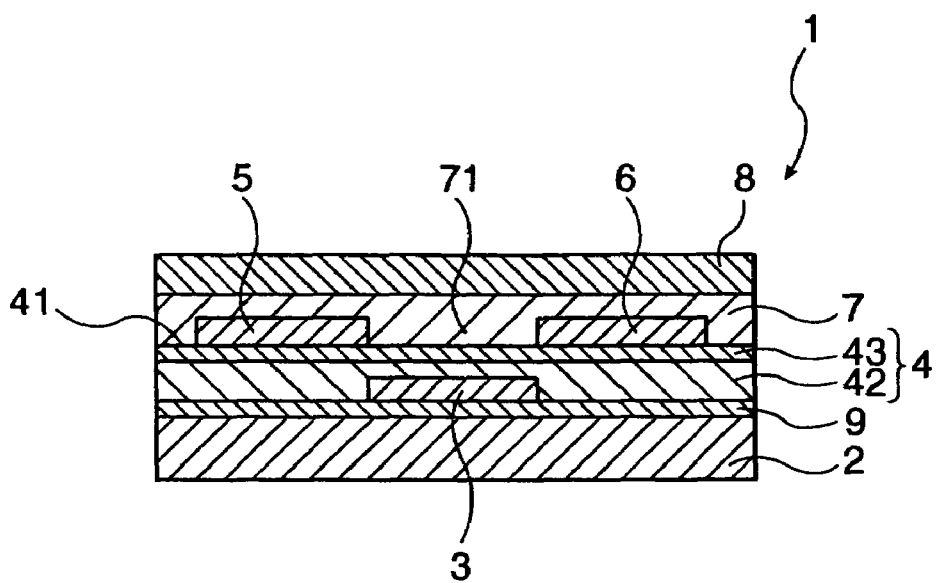
FIG. 6 is a longitudinal sectional view of a thin-film transistor according to the second embodiment of the invention.
Figure 7:
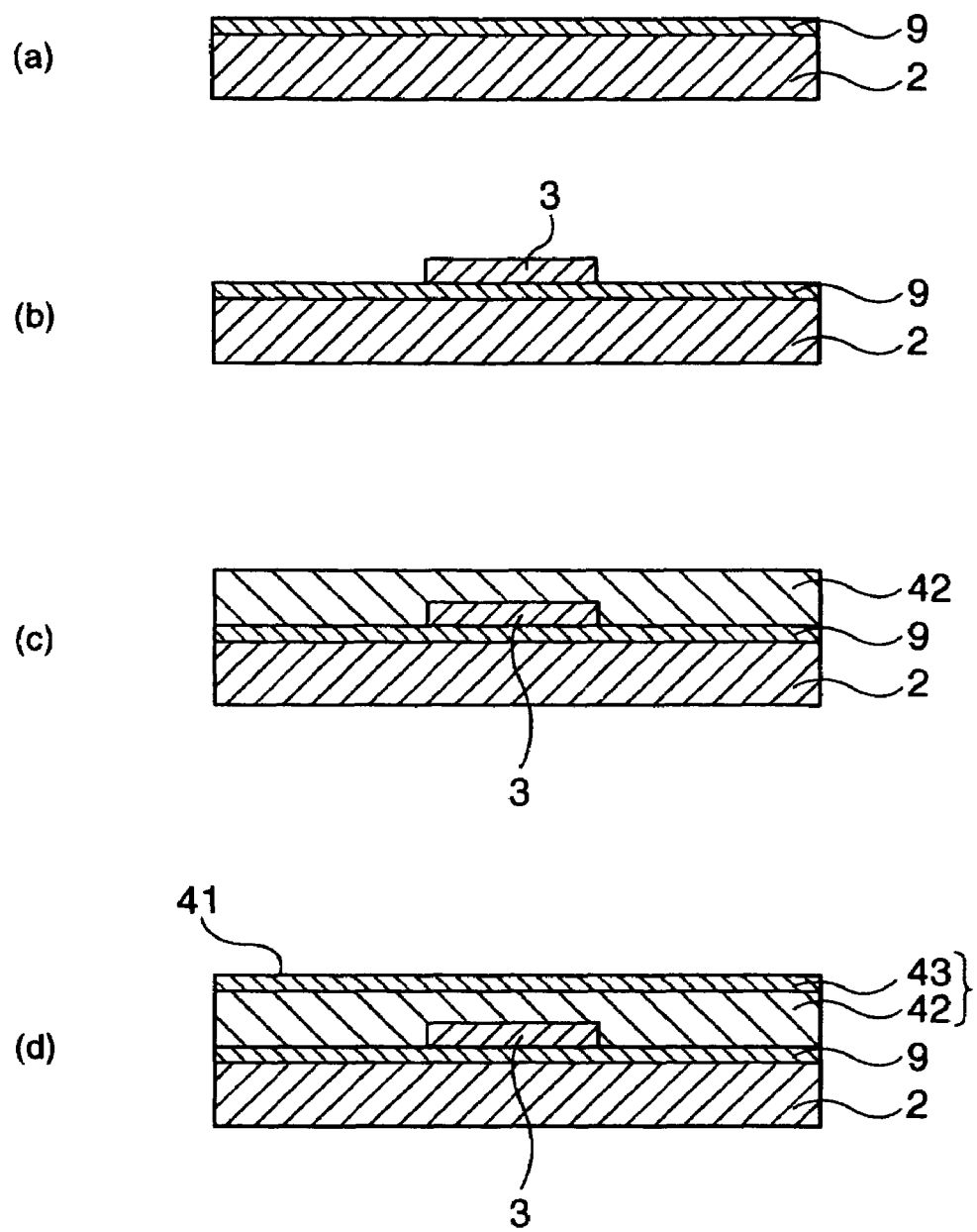
FIG. 7 is a diagram (longitudinal sectional view) illustrating a method of producing the thin-film transistor shown in FIG. 6.

A thin-film transistor according to a second exemplary embodiment of the invention is described below. FIG. 6 is a longitudinal sectional view of the thin-film transistor according to the second embodiment of the invention. FIG. 7 is a diagram (longitudinal sectional view) illustrating a method of producing the thin-film transistor shown in FIG. 6. Note that expressions in terms of relative positions or relative direction, such as "up", "upper", "down", "lower", etc., used in the following description to indicate relative positions of various parts are defined such that "upper"and similar expressions denote upper parts in FIGS. 6 and 7 and "lower" and similar expressions denote lower parts.

In the following description of the thin-film transistor 1 according to the second exemplary embodiment, the description is focused on differences from the first exemplary embodiment described above, and similar parts are not described.

The thin-film transistor 1 according to the second embodiment is similar to that according to the first exemplary embodiment except for the structure of the gate insulating layer 4.

More specifically, in the thin-film transistor 1 shown in FIG. 6, the gate insulating film 4 includes an inorganic layer (first layer) 42 mainly formed of an inorganic material on a side facing the gate electrode 3, and also includes an organic layer (second layer) 43 mainly formed of an organic material on a side facing the organic semiconductor layer 7.

Preferably, the inorganic layer 42 is formed of an insulating inorganic material having a high relative dielectric constant. This allows a further improvement in carrier mobility in the channel region 71.

Specific examples of such inorganic materials include $SiO_2$ (silicon dioxide), $Si_2N_3$ (silicon nitride), $Al_2O_3$, $Ta_2O_5$, BST, and PZT. One of such materials may be used singly or any combination of two or more materials may be used. Of those materials, it is preferable to use $SiO_2$ or $Si_2N_3$ as a main material. Those two materials have especially high insulation.

The organic layer 43 may be formed in a similar manner to that of the gate insulating layer 4 according to the first embodiment described above.

In the embodiment, the gate insulating layer 4 is formed in a two-layer structure including the inorganic layer 42 and the organic layer 43 such that the inorganic layer 42 allows the gate insulating layer 4 to have a high relative dielectric constant and the organic layer 43 allows the gate insulating layer 4 to have high capability of causing the organic semiconductor layer 7 to be aligned. Thus, the resultant gate insulating layer 4 has high quality that allows the channel region 71 to have a high carrier mobility.

The thin-film transistor 1 having the structure described above can be produced as follows.

The underlying layer is formed in a similar manner to the step described above.

The gate electrode is formed in a similar manner to the step described above.

After completion of forming the gate electrode 3 on the underlying layer 9, the inorganic layer 42 is formed. Various film formation methods may be used to form the inorganic layer 42. For example, the inorganic layer may be formed by means of a thermal oxidation method, a CVD method, a SOG method, or a polysilazane method. By using one of those methods, the inorganic layer 42 can be easily formed.

Subsequently, the organic layer 43 is formed in a similar manner to the step described above. Thereafter, formation of the source electrode 5 and the drain electrode 6, alignment treatment on the gate insulating layer 4, formation of the organic semiconductor layer 7, heat treatment on the organic semiconductor layer 7, and formation of the protective layer 8 are performed (not shown). Via the process described above, the thin-film transistor 1 according to the second embodiment is obtained.

The second embodiment described above can also provide advantages similar to those provided by the first production method.

Now, an exemplary display according to the invention is described below. The display can include an active matrix device (an electronic circuit according to the invention) including a thin-film transistor 1 similar to one of those described above. Herein, an electrophoretic display is taken as a typical example of the display according to the invention.

Figure 8:
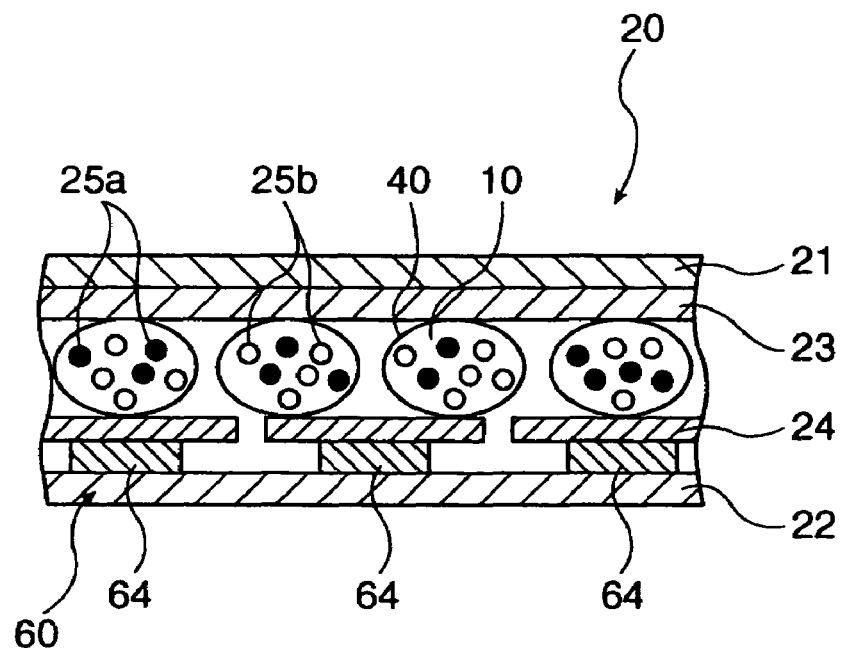
FIG. 8 is a longitudinal sectional view illustrating a display embodied as an electrophoresis display according to the invention.
Figure 9:
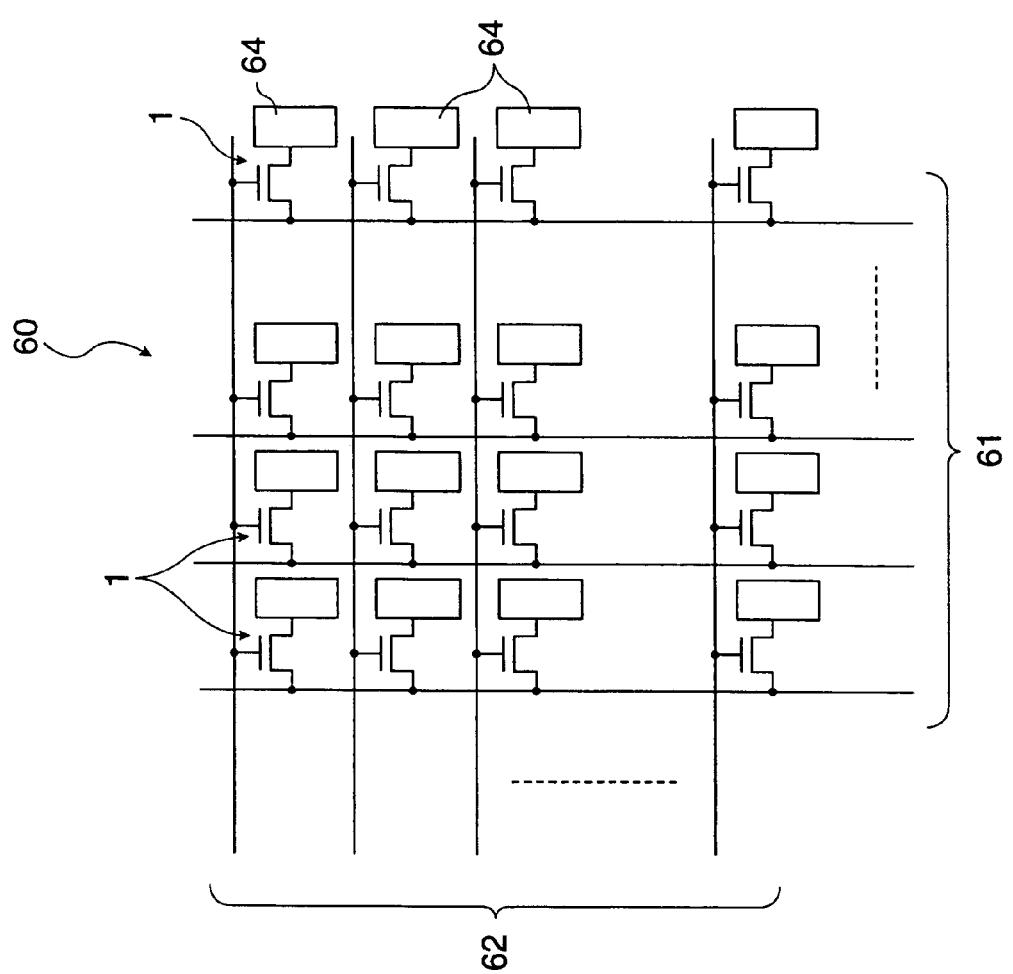
FIG. 9 is a bock diagram of an active matrix device disposed in the electrophoresis display shown in FIG. 8.

FIG. 8 is a longitudinal sectional view showing a display embodied in the form of an electrophoretic display according to an exemplary embodiment of the invention. FIG. 9 is an exemplary bock diagram of an active matrix device disposed in the electrophoresis display shown in FIG. 8.

The electrophoretic display 20 shown in FIG. 8 can include the active matrix device 60 disposed on a second substrate 22. The electrophoretic display 20 further includes a second electrode 24, a microcapsule 40, a first electrode 23 transparent to light, and a first substrate 21 transparent to light, wherein those are formed one on another in the above-descried order on the active matrix device 60.

The second electrode 24 is divided vertically and horizontally at regular intervals into the form of a matrix array. Each element of the array of the second electrode 24 is in contact with corresponding one of operating electrodes 64 disposed on the active matrix device 60.

The operating electrode 64 are formed by patterning such that the respective operating electrode 64 are disposed at the same intervals as those at which the respective elements of the second electrode 24 are disposed, and such that the respective operating electrode 64 are disposed at locations corresponding to the locations of the corresponding elements of the second electrode 24.

As shown in FIG. 9, the active matrix device 60 includes a plurality of data lines 61 and a plurality of scanning lines 62 crossing the data lines 61 at right angles A thin-film transistor (serving as a switching device) 1 and an operating electrode 64 are disposed near each intersection of the data lines 61 and the scanning lines 62.

The gate electrode 3 of the thin-film transistor 1 is connected to corresponding one of the scanning lines 62, one of the source electrode 5 and the drain electrode 6 is connected to corresponding one of the data lines 61, and the other is connected to corresponding one of the operating electrode 64.

In each capsule 40, two or more different types of electrophoretic particles are encapsulated. Each type of electrophoretic particles is different in characteristics from the other types of electrophoretic particles. In the embodiment, a liquid dispersion of electrophoretic particles 10 including two types of electrophoretic particles 25a and 25b different in charge and color (hue) is encapsulated in each capsule 40.

In this electrophoretic display 20, if a selection signal (selection voltage) is applied to one or more scanning lines 62, thin-film transistors 1 connected to the one or more scanning lines 62 to which the selection signal (selection voltage) is applied are turned on.

As a result, a data line 61 and an operating electrode 64 connected to each one of those turned-on thin-film transistors 1 are effectively connected with each other. In this state, if a particular data (voltage) is supplied to the data line 61, the data (voltage) is supplied to the second electrode 24 via the operating electrode 64.

As a result, an electric field appears between the first electrode 23 and the second electrode 24, and the electrophoretic particles 25a and 25b are electrophoretically moved toward one of the electrodes 23 and 24 depending on the direction and the strength of the electric field and also depending on the characteristics of the electrophoretic particles 25a and 25b.

In this state, if supplying of the selection signal (selection voltage) to the scanning line 62 is stopped, the thin-film transistor 1 is turned off, and thus the data line 61 and the operating electrode 64 connected to the thin-film transistor 1 are electrically disconnected from each other.

Therefore, by properly controlling turning on/off of the selection signal to the scanning lines 62 and turning on/off of the data signal to the data lines 61, it is possible to display a desired image (information) on the screen panel (on the surface of the first substrate 21, in the embodiment) of the electrophoretic display 20.

In the electrophoretic display 20 according to the embodiment, use of different colors for the respective types of electrophoretic particles 25a and 25b makes it possible to display a multi-level image.

Furthermore, in the electrophoretic display 20 according to the embodiment, the provision of the active matrix device 60 makes it possible to selectively turn on/off the thin-film transistors 1 connected to a particular scanning line 62 at a high operating speed without creating significant crosstalk, thereby making possible to display a high-quality image (information).

Furthermore, the electrophoretic display 20 according to the embodiment can be operated by a low driving voltage, and thus a reduction in power consumption is achieved.

The electrophoretic display 20 may be disposed in various types of electronic devices. Some examples of electronic devices using the electrophoretic display 20 are described below.

Figure 10:
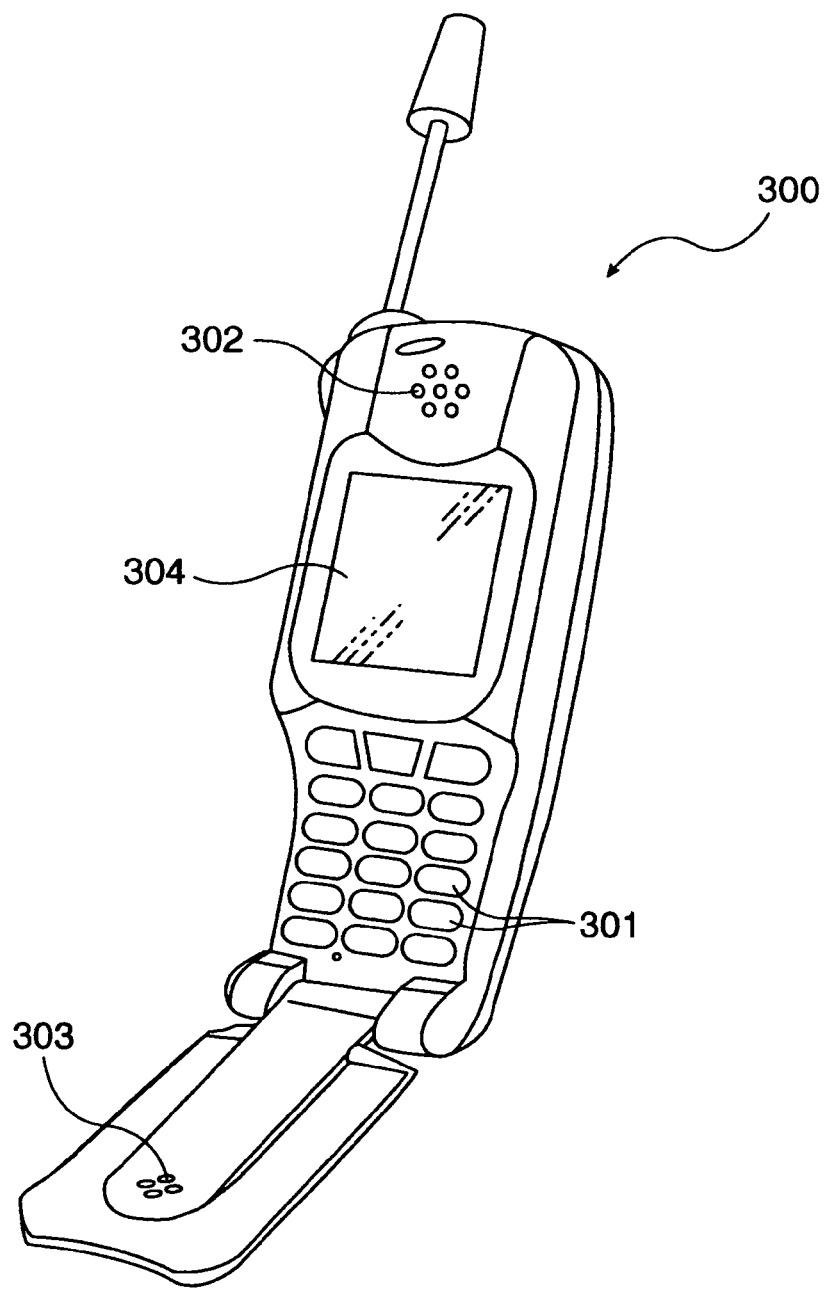
FIG. 10 a perspective view illustrating an electronic device embodied in the form of a portable telephone according to the invention.

First, a portable telephone embodied as an electronic device according to an embodiment of the invention is described. FIG. 10 a perspective view illustrating a portable telephone embodied as an electronic device according to an embodiment of the invention is described.

As shown in FIG. 10, the portable telephone 300 includes a plurality of operation control buttons 301, an ear piece 302, a mouthpiece 303, and a display panel 304.

In this portable telephone 300, the display panel 304 is formed of the electrophoretic display 20 described above, and thin-film transistors 1 according to the invention are used as active devices in a driver circuit for driving respective pixels of the electrophoretic display 20.

Figure 11:
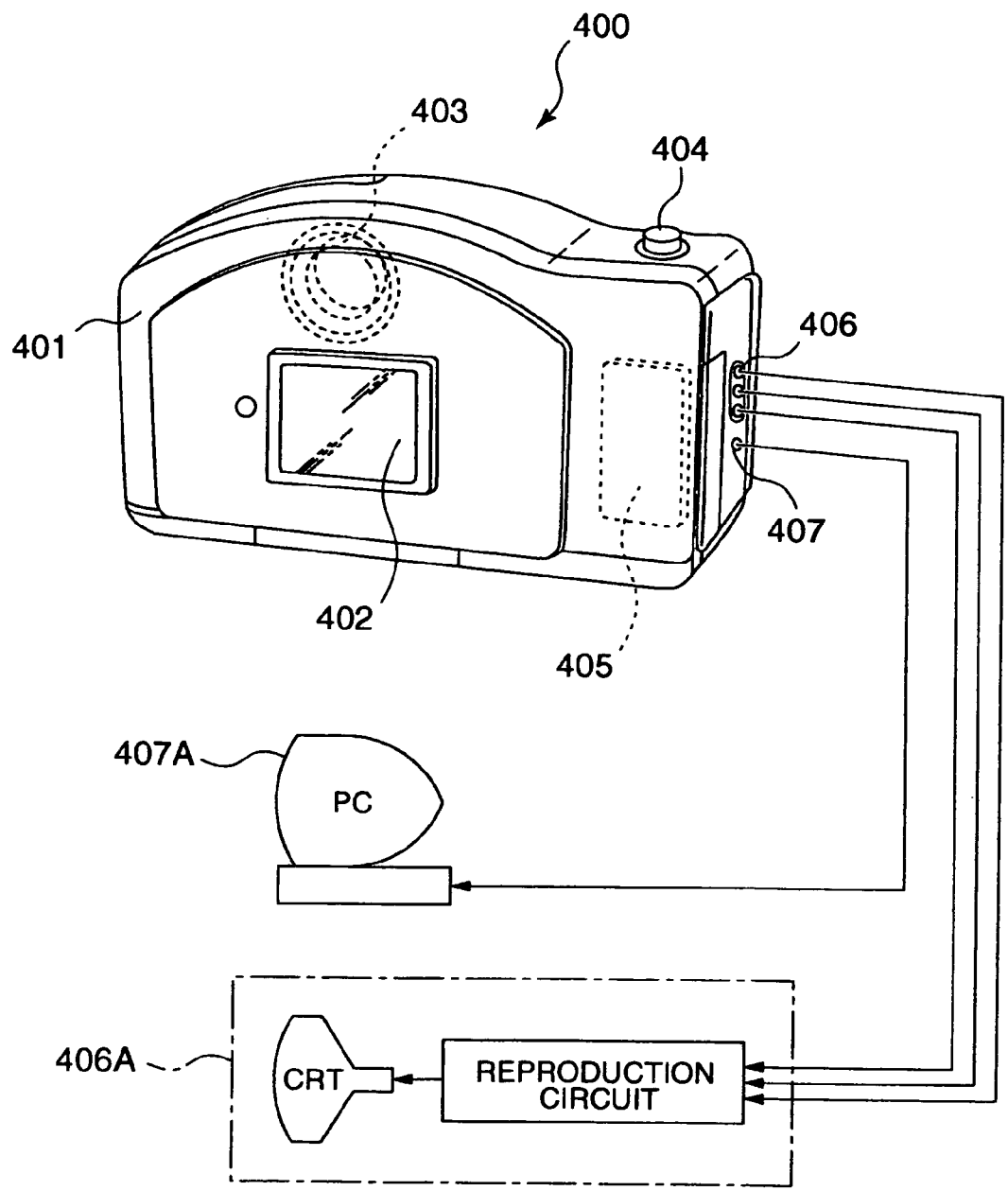
FIG. 11 a perspective view illustrating an electronic device embodied in the form of a digital still camera according to the invention.

A digital still camera embodied as an electronic device according to an embodiment of the invention is described. FIG. 11 is a perspective view illustrating a digital still camera embodied as an electronic device according to an embodiment of the invention. Note that the digital still camera viewed from its rear side is shown in FIG. 11, and its front side is hidden in the figure. FIG. 11 also shows a manner in which the digital still camera is connected to an external device.

As shown in FIG. 11, the digital still camera 400 includes a case 401, a display panel 402 disposed on the rear surface of the case 401, an optical imaging unit 403 disposed on the front surface (hidden in FIG. 11) of the case 401, a shutter button 404, and a circuit board 405.

The optical imaging unit 403 can include, for example, an optical lens, a CCD (Charge Coupled Device), etc. The display panel 402 displays an image in accordance with an image signal output from the CCD. When the shutter button 404 is pressed, an image signal output from the CCD is sent to the circuit board 405 and stored thereon.

In the digital still camera 400 according to the embodiment, a video signal output terminal 406 and a data communication input/output terminal 407 are disposed on a side face of the case 401. As required, a television monitor 406A or the like is connected to the video signal output terminal 406, and a personal computer 407A or the like is connected to the input/output terminal 407.

In this digital still camera 400, in response to a particular operation, an image signal stored in a memory on the circuit board 405 is output to the television monitor 406A or the personal computer 407A.

In this digital still camera 400, the display panel 402 is formed of the electrophoretic display 20 described above, and thin-film transistors 1 according to the invention are used as active devices in a driver circuit for driving respective pixels of the electrophoretic display 20.

Figure 12:
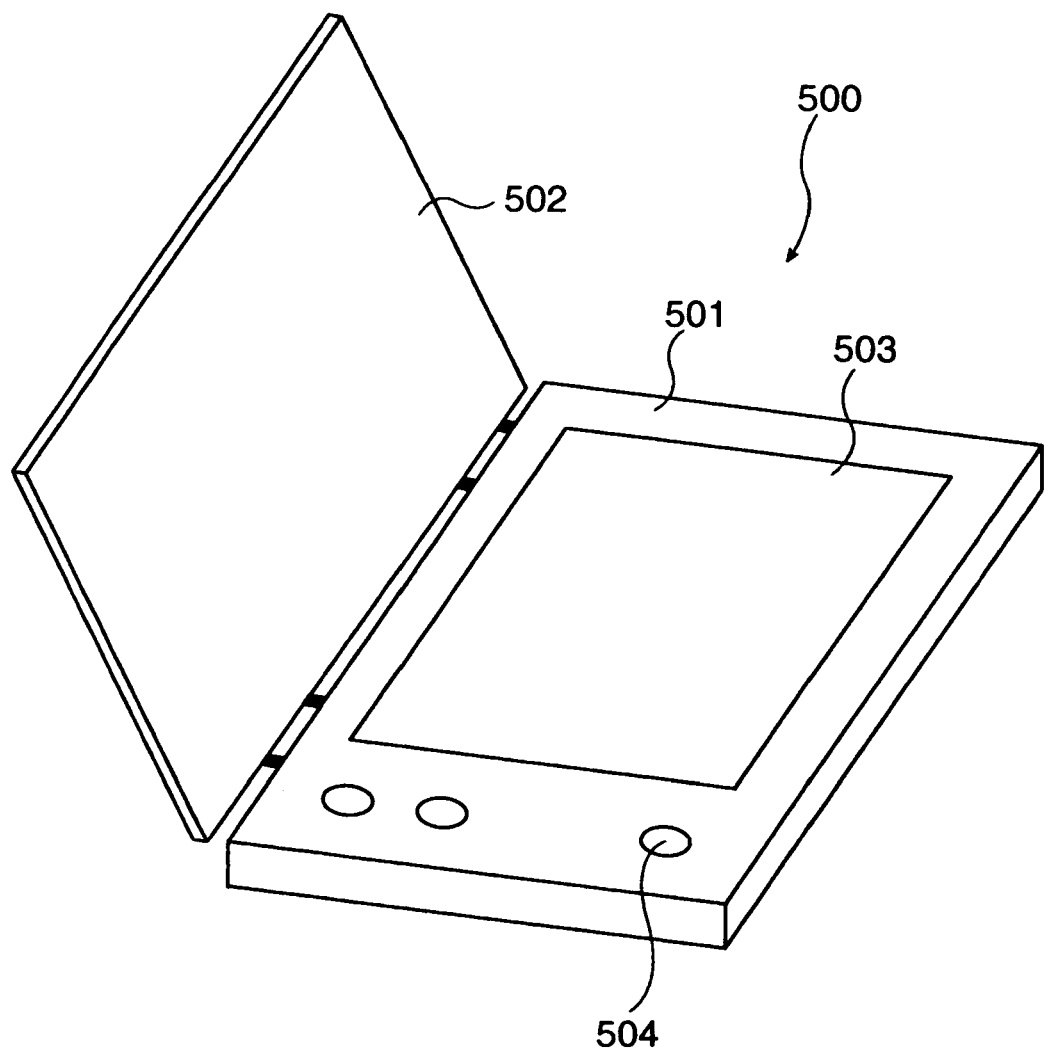
FIG. 12 a perspective view illustrating an electronic device embodied in the form of an electronic book according to the invention.

An electronic device embodied in the form of an electronic book according to the invention is described. FIG. 12 a perspective view illustrating an electronic device embodied in the form of an electronic book according to the invention.

As shown in FIG. 12, the electronic book 500 can include a frame 501 in the form of a book, and a cover 502 pivotably attached (openably/closably attached) to the frame 501. The frame 501 can include a display 503 whose display screen is exposed in FIG. 12, and an operation control panel 504.

In this electronic book 500, the display 503 is formed of the electrophoretic display 20 described above, and thin-film transistors 1 according to the invention are used as active devices in a driver circuit for driving respective pixels of the electrophoretic display 20.

Figure 13:
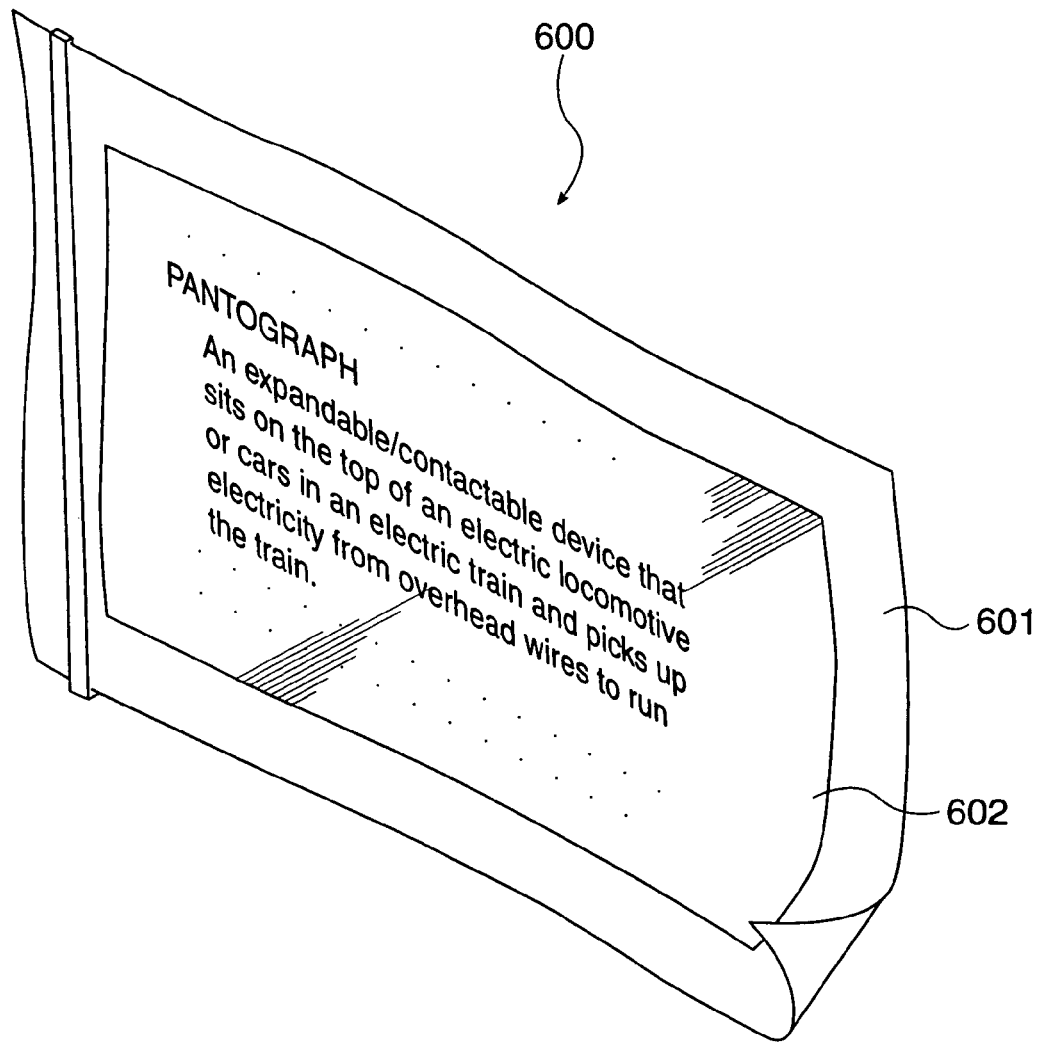
FIG. 13 a perspective view illustrating an electronic device embodied in the form of electronic paper according to the invention.

An electronic device embodied in the form of electronic paper according to the invention is described below. FIG. 13 a perspective view illustrating an electronic device embodied in the form of electronic paper according to the invention.

As shown in FIG. 13, the electronic paper 600 includes a main part 601 in the form of a rewritable sheet having a feel similar to paper and being flexible, and a display unit 602. In this electronic paper 600, the display unit 602 is formed of the electrophoretic display 20 described above, and thin-film transistors 1 according to the invention are used as active devices in a driver circuit for driving respective pixels of the electrophoretic display 20.

Figure 14:
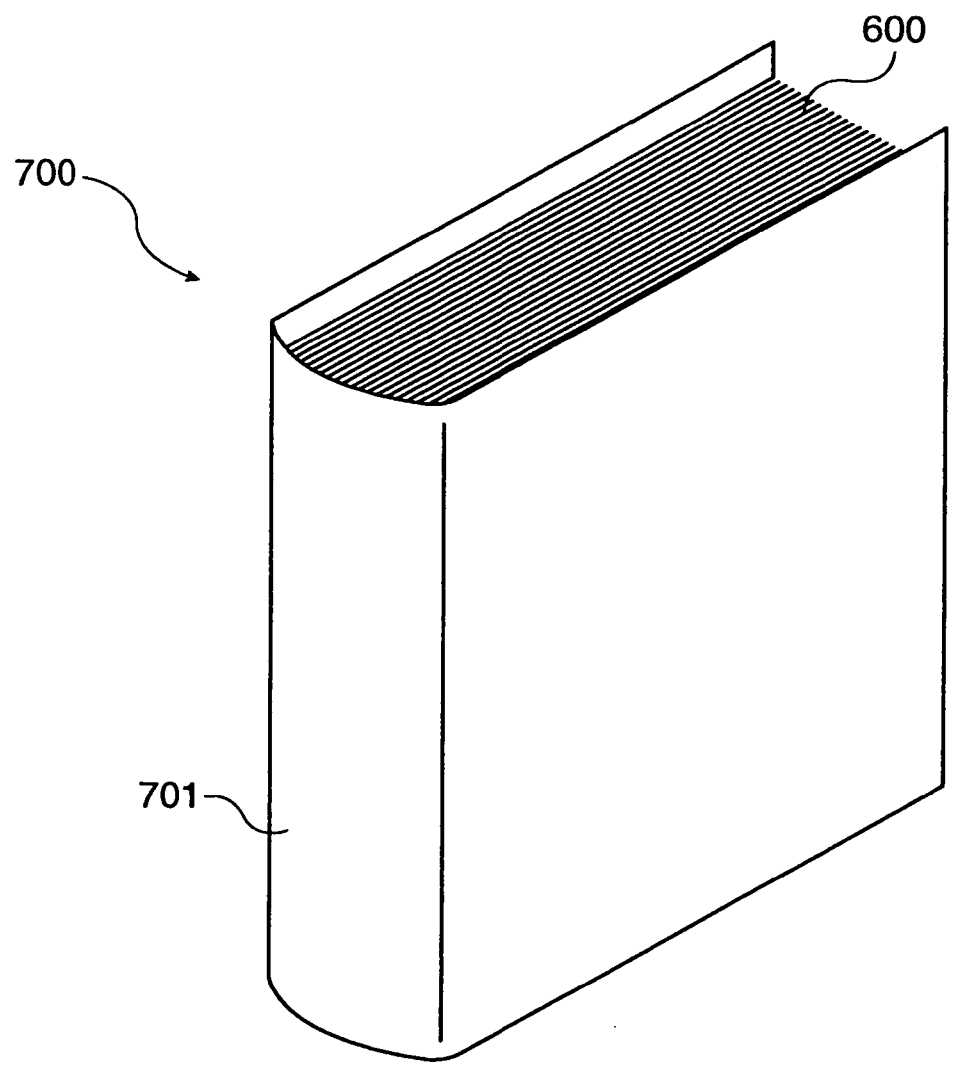
FIG. 14 a perspective view illustrating an electronic device embodied in the form of an electronic notebook according to the invention.

An electronic device embodied in the form of an electronic notebook according to the invention is described below: FIG. 14 a perspective view illustrating an electronic device embodied in the form of an electronic notebook according to the invention.

As shown in FIG. 14, the electronic notebook 700 includes a cover 701 and a bundle of electronic paper 600. Each electronic paper of the bundle 600 is similar to the electronic paper described above with reference to FIG. 13. A plurality of sheets of electronic paper are bounded bound and covered with the cover 701. The cover 701 has input means for inputting data to be displayed whereby the content to be displayed can be changed without opening the bundle of electronic paper 600.

In this electronic notebook 700, each electronic paper of the bundle 600 is formed of the electrophoretic display 20 described above, and thin-film transistors 1 according to the invention are used as active devices in a driver circuit for driving respective pixels of the electrophoretic display 20.

An electronic device embodied in the form of a display according to the invention is described below. FIGS. 15(a) and 15(b) are a cross-sectional view and a plan view, respectively, illustrating an electronic device embodied in the form of a display according to the invention.

Figure 15:
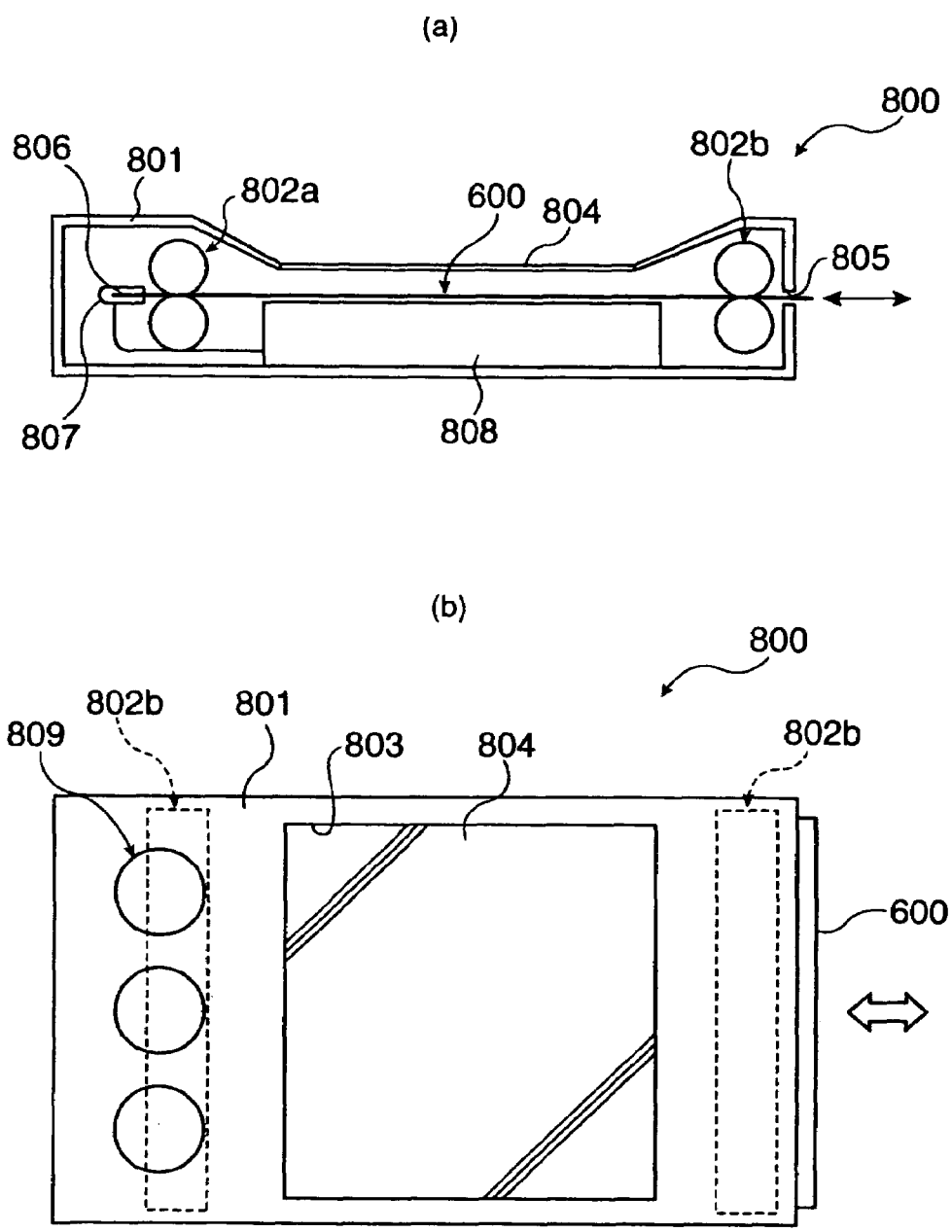
FIG. 15 a diagram illustrating an electronic device embodied in the form of a display according to the invention.

As shown in FIG. 15, the display 800 includes a main part 801 and electronic paper 600 detachably attached to the main part 801. The electronic paper 600 is similar to that described above with reference to FIG. 13.

An insertion slot 805 through which to insert the electronic paper 600 into the main part 801 is formed on a side (right-hand side in FIG. 15) of the main part 801. Two transport roller pairs 802a and 802b are disposed inside the main part 801. If the electronic paper 600 is inserted into the main part 801 via the insertion slot 805, the electronic paper 600 is set in the main part 801 in a state in which the electronic paper 600 is pinched by the transport roller pairs 802a and 802b.

A rectangular-shaped window 803 is formed in a front panel (disposed parallel to the page of FIG. 15(b)) of the main part 801, and a transparent glass plate 804 is fit in the window 803 such that the electronic paper 600 set in the main part 801 can be viewed from the outside through the transparent glass plate 804. In other words, in this display 800, a display screen is realized by disposing the electronic paper 600 in the main part 801 such that the electronic paper 600 can be viewed through the transparent glass plate 804.

Terminals 806 are disposed on the leading end (on the left-hand side of FIG. 15) of the electronic paper 600, and a socket 807 for receiving the terminals 806 of the electronic paper 600 set in the main paper 801 is disposed inside the main part 801. The socket 807 is electrically connected with a controller 808 and an operation control panel 809.

In this display 800, the electronic paper 600 can be removed from the main part 801 and can be carried by a user.

In this display 800, the electronic paper 600 can be formed of the electrophoretic display 20 described above, and thin-film transistors 1 according to the invention are used as active devices in a driver circuit for driving respective pixels of the electrophoretic display 20.

It should be understood that specific form of the electronic device including a power supply according to the invention is not limited to those described above, but the electronic device can be embodied in other various forms such as a television set, a video tape recorder with a display serving as a viewfinder/monitor, a car navigation system, a pager, an electronic notepad, a calculator, an electronic newspaper, a word processor, a personal computer, a workstation, a video telephone, a POS terminal, and a device with a touch panel. The electrophoretic display (the display according to the invention) 20 can be used as a display in those electronic devices described above.

In the exemplary display according to the invention, the thin-film transistor according to the invention may be used to drive a pixel or may be used to form a driving circuit. The display according to the invention is not limited to the electrophoretic display 20, but the display may also be realized in different forms such as a liquid crystal display (of the transmissive type or reflective type), or an EL display using an organic or inorganic EL material.

Although the thin-film transistor, the method of producing the thin-film transistor, the electronic circuit, the display, and the electronic device according to the invention have been described above with reference to specific embodiments, the invention is not limited to the details of those embodiments, but respective parts may be replaced with other parts equivalent in function, and another part may be added.

Specific examples of the invention are described below.

1. Production of Thin-Film Transistor

EXAMPLE 1

I-1: First, an underlying layer with an average thickness of 100 nm was formed by depositing $SiO_2$ on a glass substrate by means of CVD process.

I-2: Thereafter, a Au film with an average thickness of 50 nm was formed on the underlying layer by means of vacuum evaporation, and the Au film was patterned using photolithography process so as to form a gate electrode and an interconnection line extending from the gate electrode.

I-3: A solution of a precursor of polyimide was coated by means of spin coating on the underlying layer such that the gate electrode was covered. Thereafter, heat treatment was performed at 200° C. for 1 hour thereby forming a gate insulating layer with an average thickness of 200 nm.

I-4: The upper surface of the gate insulating layer was rubbed using a rubbing apparatus to align the upper surface and a neighboring portion of the gate insulating layer into a predetermined direction. The rubbing conditions were set as follows. The pushing depth was 0.4 mm, the rotation speed was 600 rpm, and the feeding speed was 1 m/min.

I-5: A source electrode and a drain electrode were formed on the gate insulating layer such that the source electrode and the drain electrode were spaced apart from each other in a direction parallel with the alignment direction of the gate insulating layer. Interconnection lines connected with those electrodes were also formed.

The formation of those electrodes and interconnection lines were accomplished by coating an aqueous solution of PEDOT (poly-ethylenedioxythiophene) by means of ink-jet printing on the gate insulating layer, converting the coated film into a particular pattern, and heating the film at 180° C. for 2 hours.

I-6: An xylene solution of F8T2 (fluorene-bithiopheneco-polymer) was then coated as an organic semiconductor material on the gate insulating layer by means of spin coating such that the source electrode and the drain electrode were covered. After the solution film was heated to 300° C. to convert F8T2 into a liquid crystal phase, the film was rapidly cooled to room temperature thereby forming an organic semiconductor layer. As a result, the organic semiconductor layer having an average thickness of 50 nm and being aligned in a direction parallel with the direction of the channel length was obtained.

I-7: A butyl acetate solution containing PMMA (polymethylmethacrylate) was then coated on the organic semiconductor layer by means of spin coating and dried thereby forming a protective layer with an average thickness of 100 nm.

Thus, a thin-film transistor such as that shown in FIG. 1 was obtained.

EXAMPLE 2

II-1: A step similar to step I-1 was performed.

II-2: A step similar to step I-2 was performed.

II-3: A solution of a precursor of polyimide in the form of diallyl ketone was coated by means of spin coating on an underlying layer such that a gate electrode was covered. Thereafter, heat treatment was performed at 200° C. for 1 hour thereby forming a gate insulating layer with an average thickness of 200 nm.

II-4: Thereafter, a Au film with an average thickness of 50 nm was formed on the gate insulating layer by means of vacuum evaporation, and the Au film was patterned using photolithography process so as to form a source electrode, a drain electrode, and interconnection lines connected respectively with the source electrode and the drain electrode.

II-5: While heating the gate insulating layer at 180° C., the gate insulating layer was illuminated with polarized light emitted from a polarized light source, thereby aligning the upper surface and a neighboring portion of the gate insulating layer in a direction parallel with the direction of the channel length of the channel region. Thereafter, the gate insulating layer was self-cooled to a temperate lower than the glass transition point thereof.

II-6: A step similar to step I-6 was performed.

II-7: A step similar to step I-7 was performed.

Thus, a thin-film transistor such as that shown in FIG. 1 was obtained.

EXAMPLE 3

III-1: A step similar to step I-1 was performed.

III-2: A step similar to step I-2 was performed.

III-3: Thereafter, $SiO_2$ was deposited on an underlying layer by means of CVD process using TEOS (tetraethoxysilane) as a source material such that a gate electrode was covered, thereby forming an inorganic layer with an average thickness of 200 nm. A solution of a precursor of polyimide was coated by means of spin coating on the inorganic layer. Thereafter, heat treatment was performed at 200° C. for 1 hour thereby forming an organic layer with an average thickness of 20 nm.

III-4: A step similar to step I-4 was performed.

III-5: A step similar to step I-5 was performed.

III-6: A step similar to step I-6 was performed.

III-7: A step similar to step I-7 was performed.

Thus, a thin-film transistor such as that shown in FIG. 6 was obtained.

2. Evaluation

The carrier mobility in the channel region of the organic semiconductor layer was measured for the thin-film transistors produced in Example 1 to Example 3. The measurement of the carrier mobility was performed using a parameter analyzer 4156C available from Agilent Technologies Co.

The measurement results showed that the channel region of the organic semiconductor layer had a high enough carrier mobility in the range of 0.007 to 0.02 $cm^2/Vs$ for all thin-film transistors produced in Example 1 to Example 3.

While this invention has been described in conjunction with the specific embodiment thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A method of manufacturing a transistor, the method comprising:

forming a gate electrode over a substrate;

applying an inorganic material over the gate electrode to form a first gate insulating layer;

forming a second gate insulating layer on the first gate insulating layer, the second gate insulating layer including an organic polymer material, the first gate insulating layer having a higher dielectric constant than the second gate insulating layer;

forming a source electrode and a drain electrode on the second gate insulating layer;

irradiating the second gate insulating layer with a polarized light while heating the second gate insulating layer to make at least a portion of the organic polymer material to be oriented in a first direction, wherein the second gate insulating layer is heated at a temperature within a range of 100 to 200 degrees centigrade not including 200 degrees centigrade;

forming a semiconductor layer on the second gate insulating layer such that the semiconductor film is in a direct contact with the second gate insulating layer and is caused to be aligned in the first direction.

2. The method of manufacturing the transistor according to claim 1, the forming of the first gate insulating layer including forming the first gate insulating layer by a SOG material.

3. The method of manufacturing the transistor according to claim 1, the forming of the source electrode and the drain electrode including forming the source electrode and the drain electrode such that the source electrode is apart from the drain electrode along the first direction of the second gate insulating layer.

4. The method of manufacturing the transistor according to claim 1, the semiconductor layer including an organic semiconductor material, the forming of the semiconductor layer including passing a current between the source electrode and the drain electrode to heat the organic semiconductor material such that the organic semiconductor material is aligned in the first direction of the second gate insulting layer.

5. The method of manufacturing the transistor according to claim 1, the method further comprising:

forming an underlying layer before the forming of the gate electrode.

6. A method of manufacturing a transistor, the method comprising:

forming a gate electrode over a substrate;

applying an inorganic material over the gate electrode to form a first gate insulating layer;

forming a second gate insulating layer on the first gate insulating layer, the second gate insulating layer including a polyimide resin;

irradiating the second gate insulating layer with a polarized light while heating the second gate insulator at a temperature within a range of 100 to 200 degrees centigrade to make at least a portion of the organic polymer material be oriented in a first direction and;

forming a semiconductor layer on the second gate insulating layer such that the semiconductor film is in a direct contact with the second gate insulting layer and is caused to be aligned in the first direction.

7. The method of manufacturing the transistor according to claim 6, the method further comprising:

forming a source electrode and a drain electrode on the second gate insulating layer, the source electrode and the drain electrode sandwiching a portion of the semiconductor layer aligned in the first direction.

8. The method of manufacturing the transistor according to claim 7, the method further comprising:

forming a protective layer on the semiconductor layer.

9. The method of manufacturing the transistor according to claim 8, the semiconductor layer including an organic semiconductor material, the forming of the semiconductor layer including a passing a current between the source electrode and the drain electrode to heat the organic semiconductor material such that the organic semiconductor material is aligned in the first direction of the second gate insulating layer.

10. The method of manufacturing the transistor according to claim 7, the first gate insulating layer having a higher dielectric constant than the second insulting layer.

11. The method of manufacturing the transistor according to claim 7, the forming of the first gate insulating layer including forming the first gate insulating layer by a polysilazane method.

12. A method of manufacturing a transistor, the method comprising:

forming a gate electrode over a substrate;

applying an inorganic material over the gate electrode to form a first gate insulating layer;

forming a second gate insulating layer on the first gate insulating layer, the second gate insulating layer including an organic polymer material, the first gate insulating layer having a higher dielectric constant than the second gate insulating layer;

forming a source electrode and a drain electrode on the second gate insulating layer;

irradiating the second gate insulating layer with a polarized light while heating the second gate insulator at a temperature within a range of 100 to 200 degrees centigrade to make at least a portion of the organic polymer material be oriented in a first direction;

forming a semiconductor layer on the second gate insulating layer such that the semiconductor film is in a direct contact with the second gate insulating layer, the semiconductor layer including an organic semiconductor material; and passing a current between the source electrode and the drain electrode to cause the organic semiconductor material to be aligned between the source electrode and the drain electrode.

13. The method of manufacturing the transistor according to claim 12, the second gate insulating layer including a polyimide resin in a form of diallyl ketone.

14. The method of manufacturing the transistor according to claim 13, the forming of the first gate insulating layer being heated at a temperature within a range of 100 to 200 degrees centigrade.

15. The method of manufacturing the transistor according to claim 13, the forming of the first gate insulating layer including forming the first gate insulating layer by a SOG method.

* * * * *